(12) United States Patent (10) Patent No.: US 8,371,891 B2
Nakamura et al. (45) Date of Patent: Feb. 12, 2013

(54) DISPLAY DEVICE, METHOD FOR MANUFACTURING THE SAME AND APPARATUS FOR MANUFACTURING THE SAME

(75) Inventors: Osamu Nakamura, Atsugi (JP); Yoshitaka Moriya, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/234,294

(22) Filed: Sep. 16, 2011

(65) Prior Publication Data

US 2012/0009698 A1 Jan. 12, 2012

Related U.S. Application Data

(62) Division of application No. 11/213,911, filed on Aug. 30, 2005, now Pat. No. 8,040,469.

(30) Foreign Application Priority Data

Sep. 10, 2004 (JP) ................................ 2004-264580

(51) Int. Cl.
*H01J 9/26* (2006.01)
(52) U.S. Cl. ............ 445/25; 313/512; 349/187; 349/191
(58) Field of Classification Search .................... 445/25; 313/506, 512; 349/106, 187, 191
See application file for complete search history.

(56) References Cited

U.S. PATENT DOCUMENTS

| 5,069,533 | A | | 12/1991 | Yuasa et al. |
| 5,709,065 | A | * | 1/1998 | Krause ........................ 53/400 |
| 5,757,456 | A | | 5/1998 | Yamazaki et al. |
| 5,929,961 | A | | 7/1999 | Nishi et al. |
| 6,127,199 | A | | 10/2000 | Inoue et al. |
| 6,149,482 | A | | 11/2000 | Sakasegawa et al. |

(Continued)

FOREIGN PATENT DOCUMENTS

| CN | 1392439 | 1/2003 |
| EP | 0 858 110 A | 8/1998 |

(Continued)

OTHER PUBLICATIONS

Terada et al., *54.5L: Late-News Paper: A 24-inch AM-OLED Display with XGA Resolution by Novel Seamless Tiling Technology*, SID Digest '03, SID International Symposium Digest of Technical Papers, Jan. 1, 2003, pp. 1463-1465.

(Continued)

*Primary Examiner* — Mary Ellen Bowman
(74) *Attorney, Agent, or Firm* — Eric J. Robinson; Robinson Intellectual Property Law Office, P.C.

(57) ABSTRACT

The present inventions provides a method for manufacturing a film-type display device efficiently, and a method for manufacturing a large-size film-type display device, and an apparatus for manufacturing the film-type display device. An apparatus for manufacturing a film-type display device includes: transferring means for transferring a substrate over which an integrated circuit constituting the display device is provided; first separating means for separating the integrated circuit from the substrate by adhering a first sheet material to one surface of the integrated circuit; second separating means for separating the integrated circuit from the first sheet material by adhering a second sheet material to the other surface of the integrated circuit; processing means for forming one or both of a conductive film and an insulating film on the integrated circuit; and sealing means for sealing the processed integrated circuit with the second sheet material and a third sheet material.

18 Claims, 22 Drawing Sheets

U.S. PATENT DOCUMENTS

| | | | |
|---|---|---|---|
| 6,320,640 B2 | 11/2001 | Nishi et al. | |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,727,970 B2 * | 4/2004 | Grace et al. | 349/187 |
| 6,814,832 B2 | 11/2004 | Utsunomiya | |
| 6,818,530 B2 | 11/2004 | Shimoda et al. | |
| 6,839,123 B2 | 1/2005 | Nishi et al. | |
| 6,849,877 B2 | 2/2005 | Yamazaki et al. | |
| 6,943,050 B2 | 9/2005 | Kondo | |
| 7,045,438 B2 | 5/2006 | Yamazaki et al. | |
| 7,060,153 B2 | 6/2006 | Yamazaki et al. | |
| 7,094,665 B2 | 8/2006 | Shimoda et al. | |
| 7,211,828 B2 | 5/2007 | Yamazaki et al. | |
| 7,285,476 B2 | 10/2007 | Shimoda et al. | |
| 7,332,381 B2 | 2/2008 | Maruyama et al. | |
| 7,420,208 B2 | 9/2008 | Yamazaki et al. | |
| RE40,601 E | 12/2008 | Inoue et al. | |
| 7,468,308 B2 | 12/2008 | Shimoda | |
| 7,648,862 B2 | 1/2010 | Maruyama et al. | |
| 7,728,326 B2 | 6/2010 | Yamazaki et al. | |
| 7,750,552 B2 | 7/2010 | Yamazaki et al. | |
| 7,862,677 B2 | 1/2011 | Nakajima et al. | |
| 7,952,101 B2 | 5/2011 | Yamazaki et al. | |
| 7,994,506 B2 | 8/2011 | Maruyama et al. | |
| 2001/0013848 A1 | 8/2001 | Shibata et al. | |
| 2002/0027625 A1 * | 3/2002 | Nishi et al. | 349/106 |
| 2002/0195931 A1 | 12/2002 | George et al. | |
| 2003/0173891 A1 | 9/2003 | Chiba et al. | |
| 2004/0032209 A1 | 2/2004 | Wu et al. | |
| 2004/0065404 A1 | 4/2004 | Furukawa et al. | |
| 2004/0155857 A1 * | 8/2004 | Duthaler et al. | 345/107 |
| 2005/0105039 A1 | 5/2005 | Nishi et al. | |
| 2010/0163859 A1 | 7/2010 | Yamazaki et al. | |

FOREIGN PATENT DOCUMENTS

| | | |
|---|---|---|
| EP | 1 351 308 A | 10/2003 |
| EP | 1 655 633 A | 5/2006 |
| EP | 1 744 365 A | 1/2007 |
| EP | 1 758 169 A | 2/2007 |
| JP | 02-220392 A | 9/1990 |
| JP | 05-313151 A | 11/1993 |
| JP | 2001-272923 A | 10/2001 |
| JP | 2002-221911 A | 8/2002 |
| JP | 2003-100450 A | 4/2003 |
| JP | 2003-142666 A | 5/2003 |
| JP | 2003-204049 A | 7/2003 |
| JP | 2004-047691 A | 2/2004 |
| JP | 2004-140380 A | 5/2004 |

OTHER PUBLICATIONS

Office Action (Application No. 200510099190.8) dated Jun. 27, 2008.

* cited by examiner

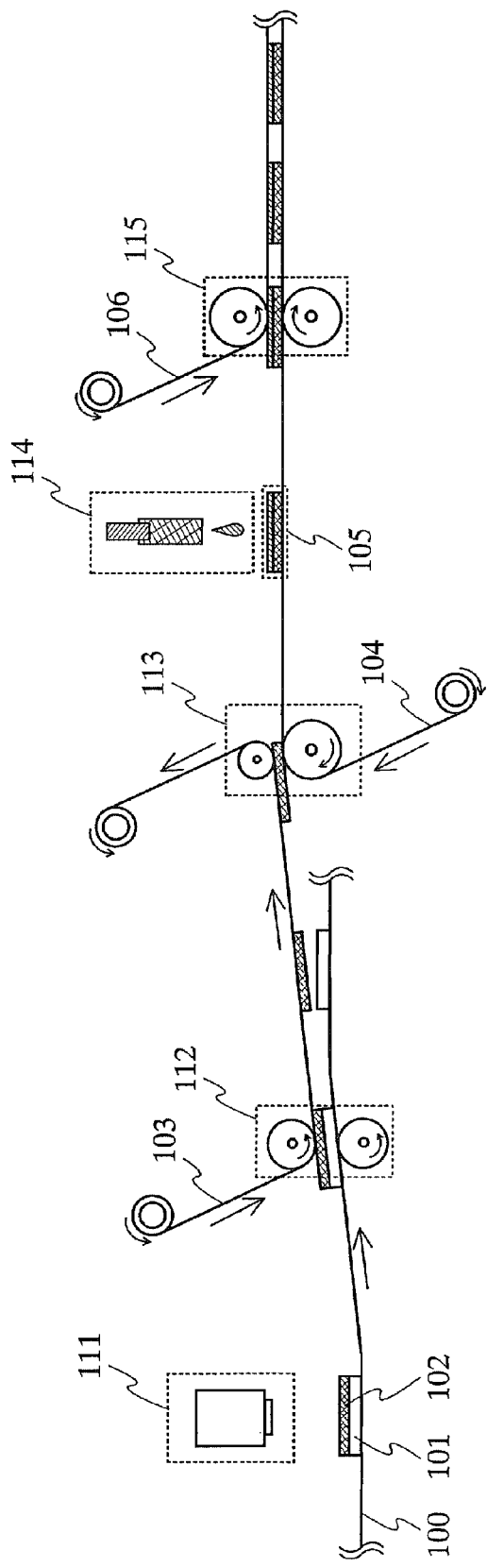
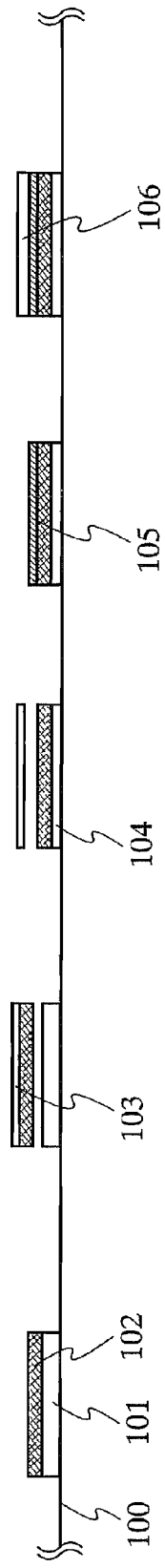
FIG.1A
FIG.1B

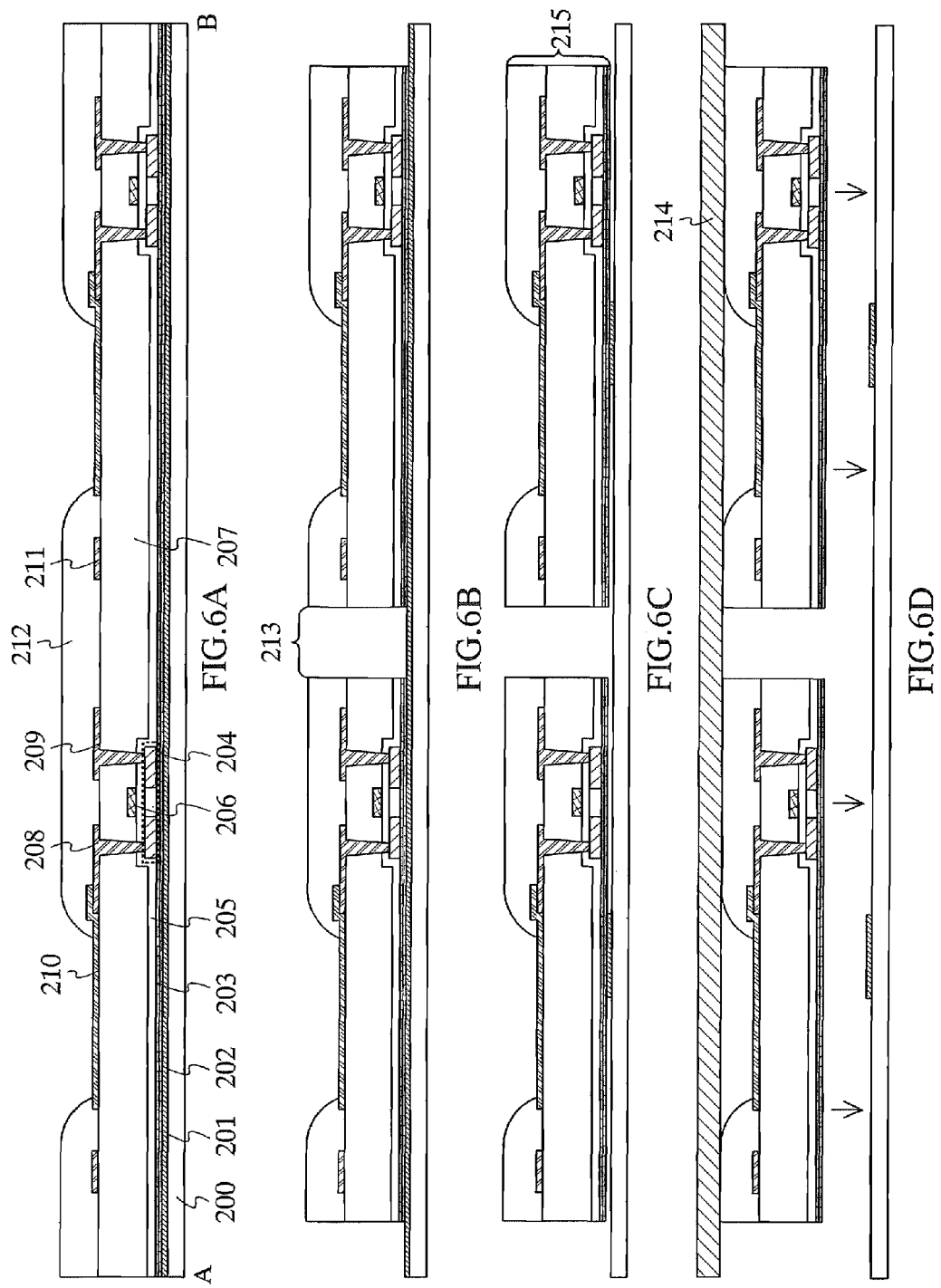

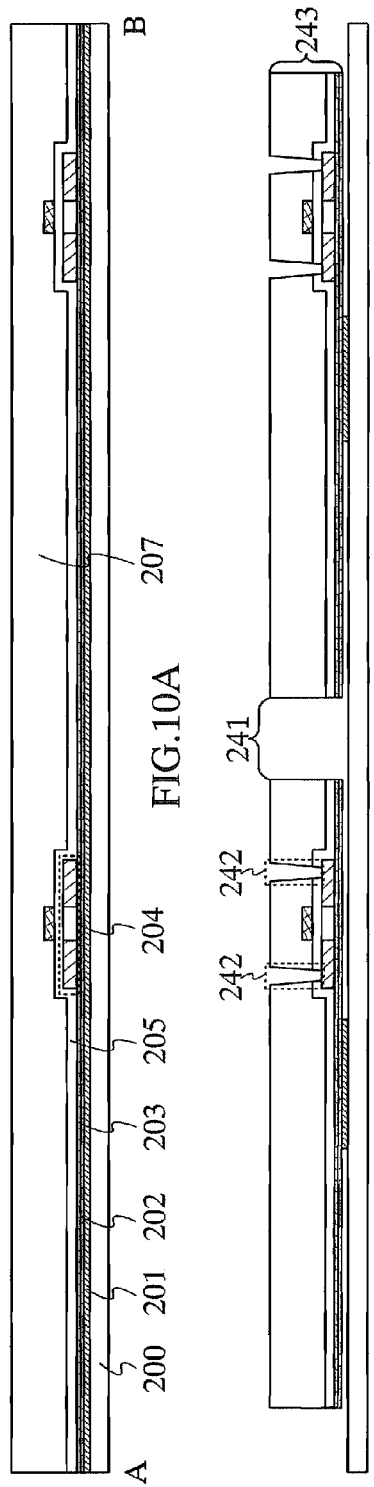
FIG.10A
FIG.10B
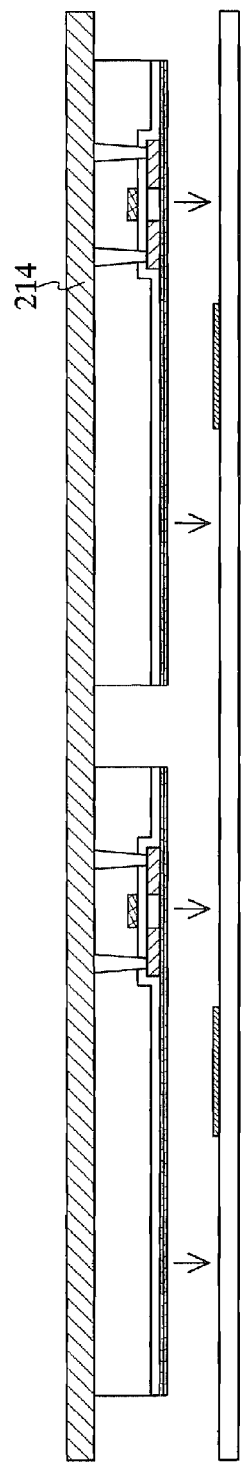
FIG.10C
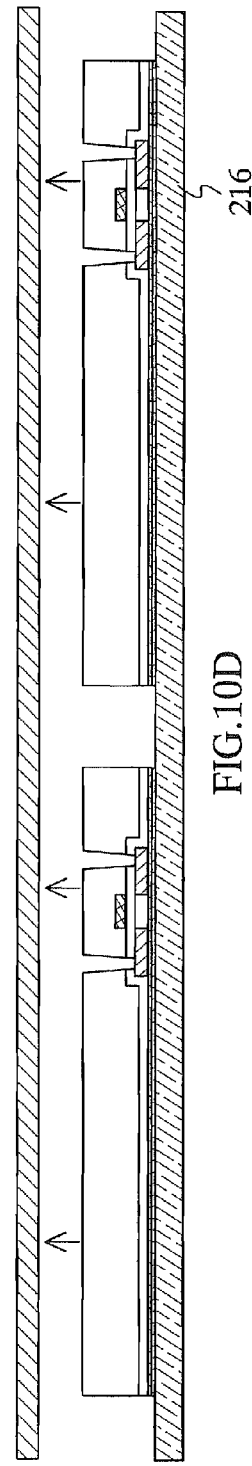
FIG.10D

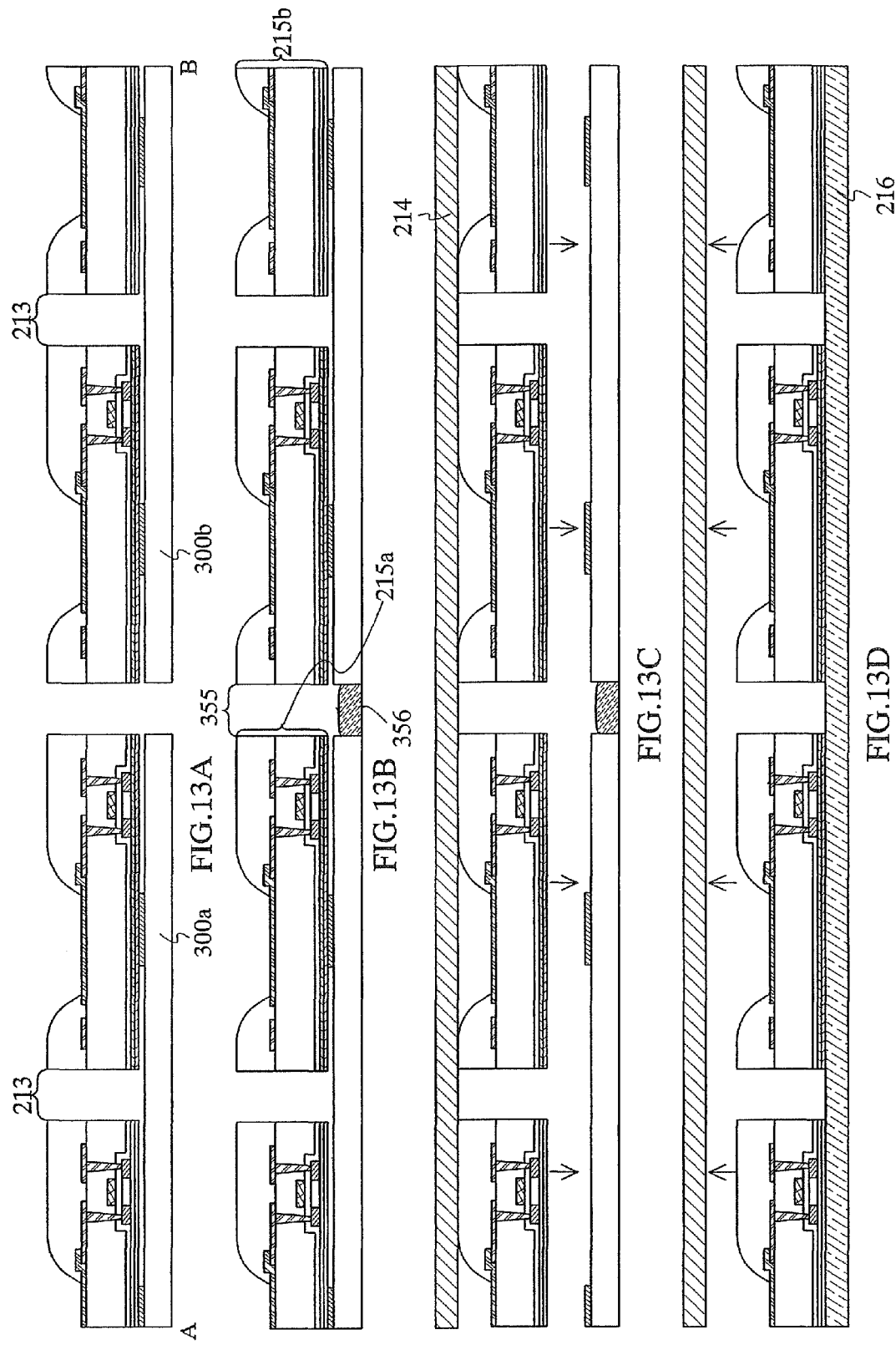

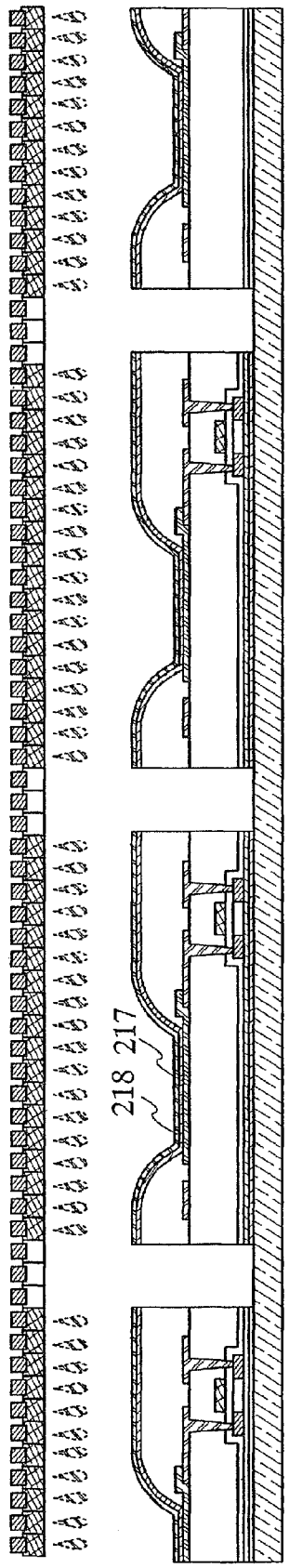
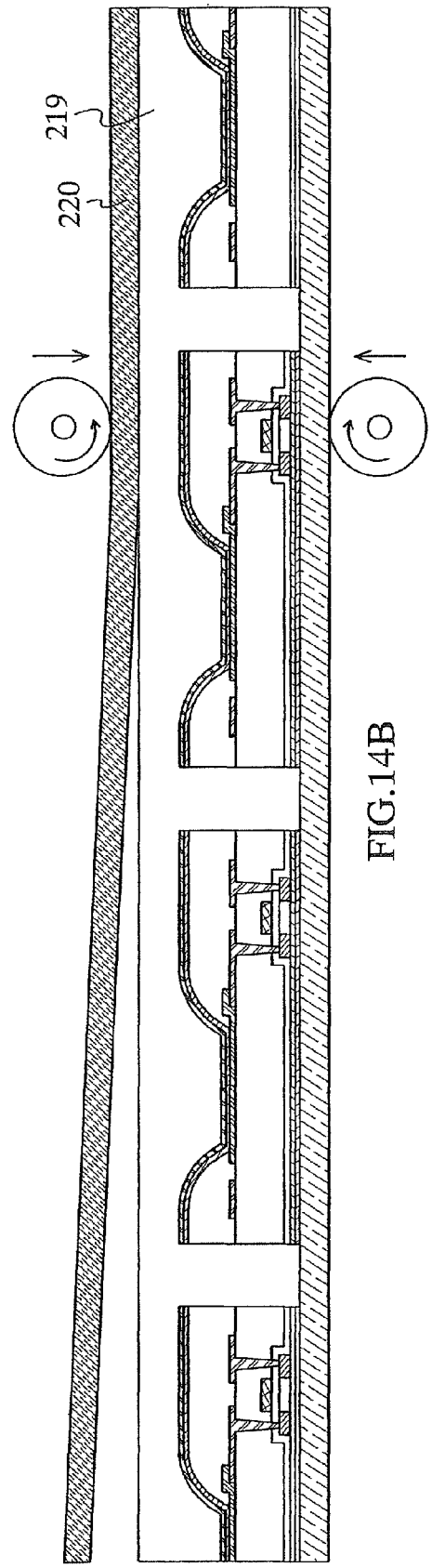
FIG.14A
FIG.14B

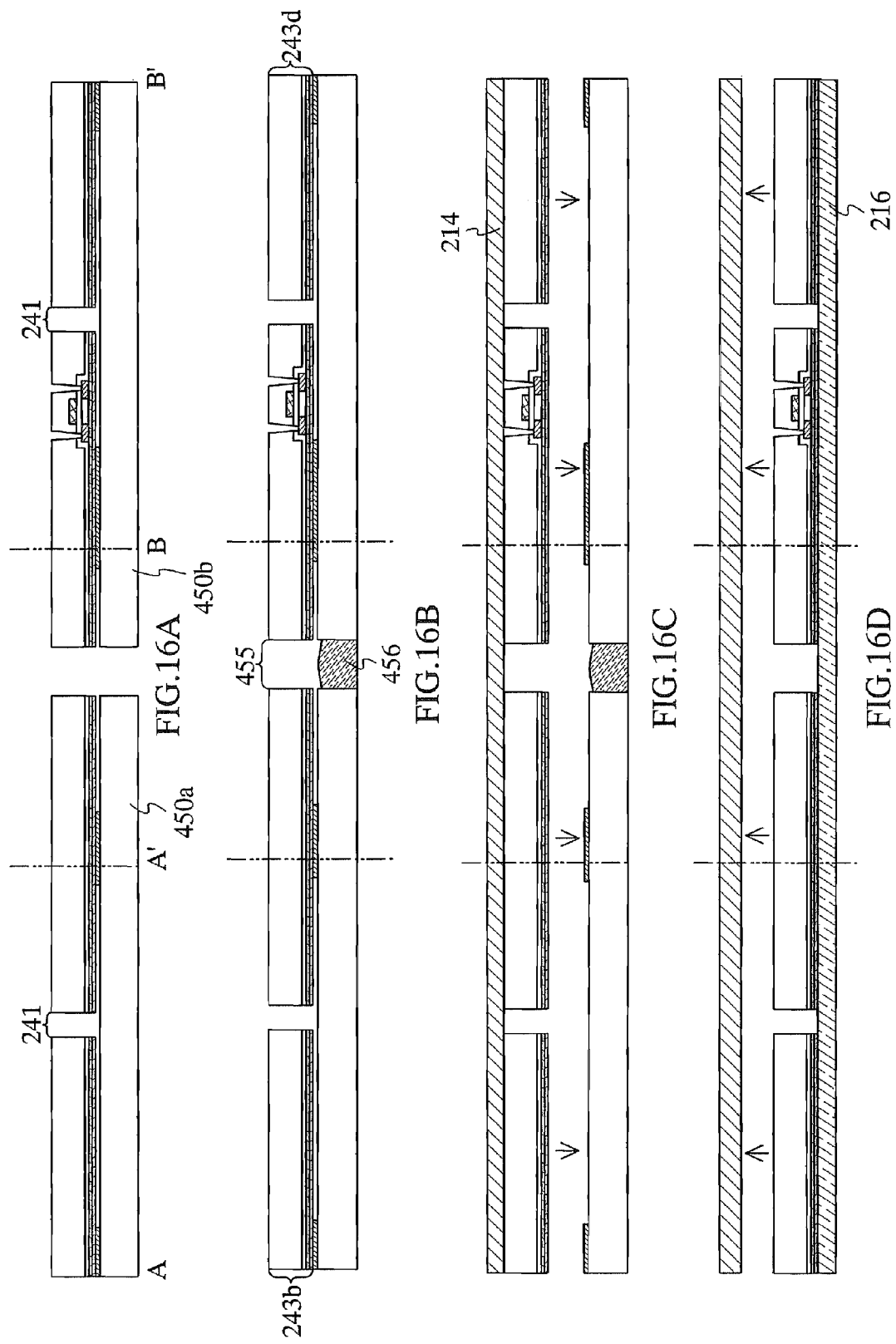

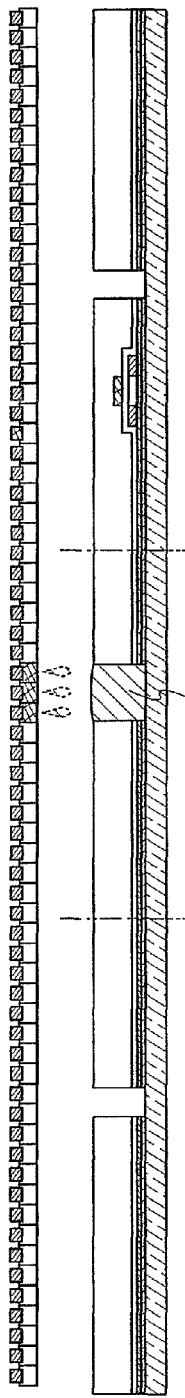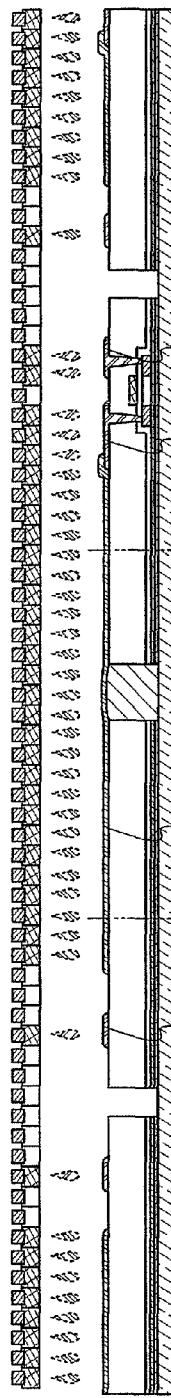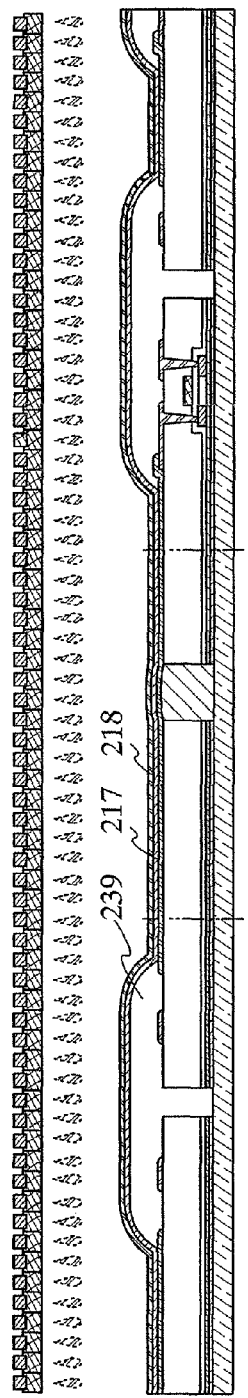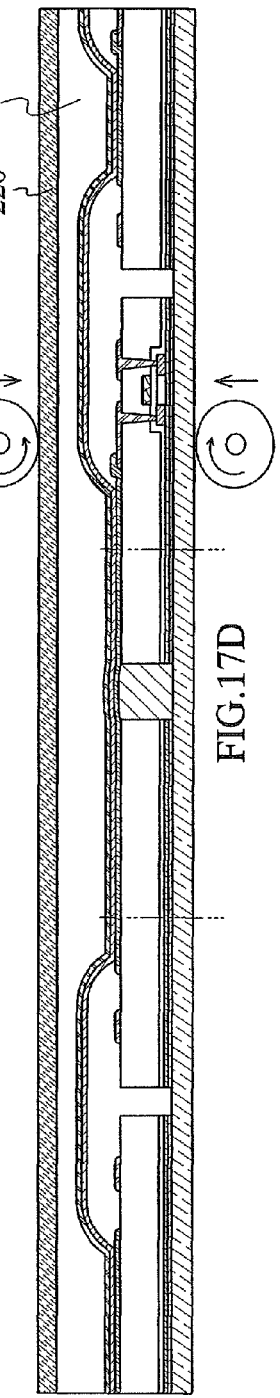
FIG.17A 457
FIG.17B
FIG.17C
FIG.17D

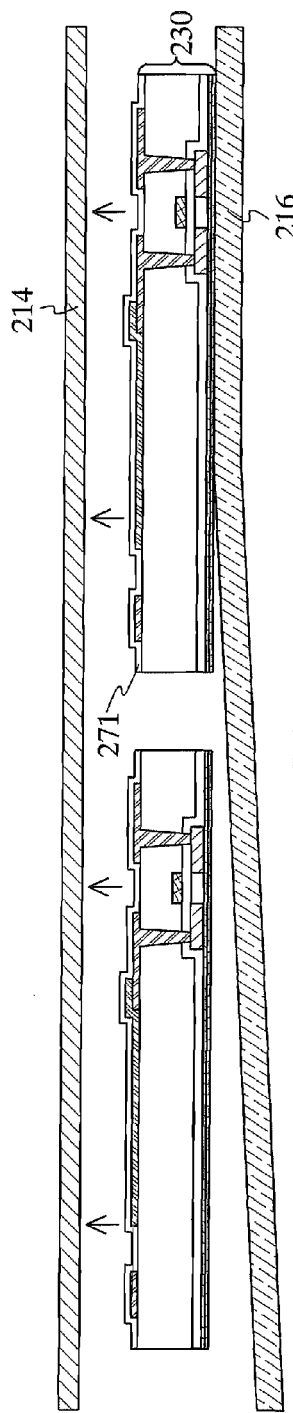
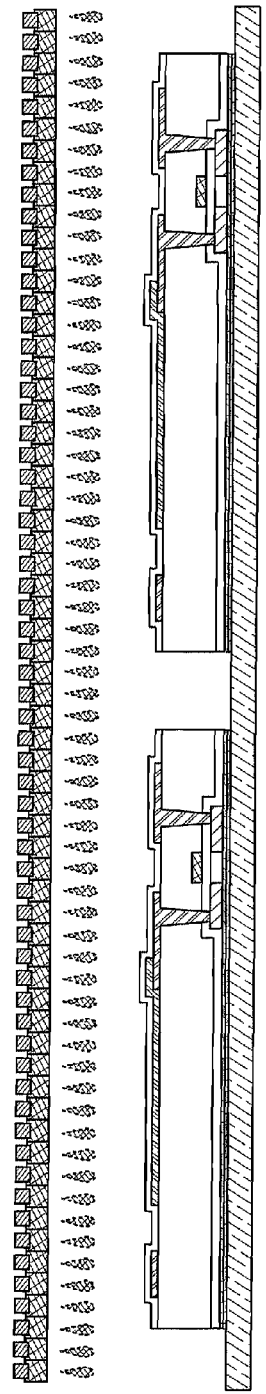
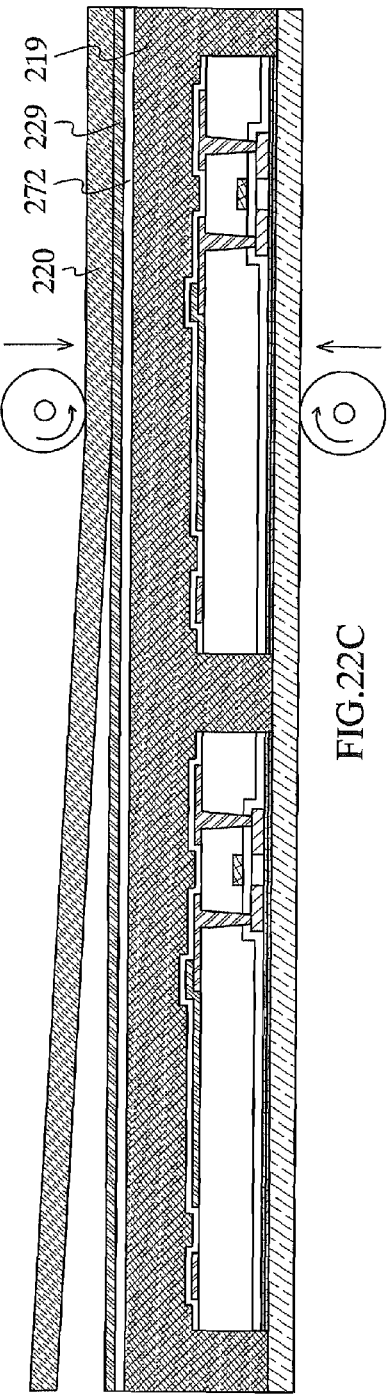
FIG.22A
FIG.22B
FIG.22C

DISPLAY DEVICE, METHOD FOR MANUFACTURING THE SAME AND APPARATUS FOR MANUFACTURING THE SAME

BACKGROUND OF THE INVENTION

1. Field of the Invention

The present invention relates to a display device, a method for manufacturing the display device and an apparatus for manufacturing the display device. In particular, the invention relates to a display device formed over a flexible substrate that can be bent, a method for manufacturing thereof and an apparatus for manufacturing thereof.

2. Description of the Related Art

In recent years, research and development of display devices using light emitting elements have been carried out actively. The display devices using the light emitting elements do not require backlights unlike display devices using liquid crystal and the like. Further, the display devices using the light emitting elements also have advantages of high viewing angle and the like. Also, film-type display devices that can be bent themselves have been attracting attention, recently.

Methods for manufacturing the film-type display devices are mainly classified into two types. In one method for manufacturing the film-type display device, a flexible substrate such as plastic is prepared in advance, and circuit patterns such as a wiring and a pixel electrode are directly formed over the substrate by using a metal material or an insulating material. In another method for manufacturing the film-type display device, circuit patterns such as a wiring and a pixel electrode are formed over a substrate with rigidity such as glass in advance by using a metal material and an insulating materials, and then only the substrate with rigidity is grinded or polished to be reduced in thickness or the substrate with the rigidity is replaced by a flexible substrate.

However, when a film-type display device is manufactured by directly forming a metal material or an insulating material over a flexible substrate made from plastic or the like, manufacturing conditions are limited due to a heat resistance property of the substrate and the like. That is, the display device should be manufactured in consideration of various sorts of resistance properties such as the heat resistance property and the strength of the flexible substrate. For example, in the case of forming pixels, driver circuits and the like of a display device are formed using thin film transistors (TFTs), conditions of a heat treatment and the like are limited so that a semiconductor film cannot be crystallized sufficiently. Therefore, TFTs having excellent characteristics cannot be obtained.

On the other hand, when a film-type display device is formed by forming a display device over a substrate with rigidity such as a glass substrate, separating the display device from the substrate with the rigidity and transferring to a flexible substrate, there are a problem of disconnection of a wiring and the like due to stress applied to the display device in separation and a problem where a large size display device is difficult to be manufactured since the size of the display device depends on the size of the substrate (which is the glass substrate here).

SUMMARY OF THE INVENTION

In view of the above problems, it is an object of the present invention to provide a method for manufacturing a film-type display device efficiently along with a large-size film-type display device, an apparatus for manufacturing a film-type display device, and a film-type display device.

In an aspect of the present invention, an apparatus for manufacturing a display device includes: transferring means for transferring a substrate over which an element formation portion constituting the display device are provided; first separating means for separating the element formation portion form the substrate by adhering one surface of the element formation portion to a first sheet material; second separating means for separating the element formation portion from the first sheet material by adhering the other surface of the element formation portion to a second sheet material; processing means for forming a pixel portion on the element formation portion; and sealing means for sealing the processed element formation portion by sandwiching it with the second sheet material and a third sheet material.

In another aspect of the invention, an apparatus for manufacturing a display device includes: transferring means for transferring a substrate over which an element formation portion constituting the display device is provided; a first supply roll to which a first sheet material is reeled; first separating means for separating the element formation portion from the substrate by adhering one surface of the element formation portion to the first sheet material; a second supply roll to which a second sheet material is reeled; second separating means for separating the element formation portion from the first sheet material by adhering the other surface of the element formation portion to the second sheet material; processing means for forming a pixel portion on the element formation portion; a third supply roll to which a third sheet material is reeled; sealing means for sealing the processed element formation portion by sandwiching it with the second sheet material and the third sheet material; and a collection roll to which the thus sealed display device is reeled. In the above structure of the present invention, as a method for sealing the processed element formation portion with the second sheet material and the third sheet material, the element formation portion can be sealed by squeezing out the third sheet material in a heated molten state.

In the above structure, the apparatus for manufacturing the display device according to the invention can be applied to a case where a display device is formed by connecting element formation portions constituting display devices that are provided over a plurality of different substrates. In this case, the alignment of the plurality of substrates is adjusted accurately by using controlling means prior to separating the element formation portions provided over the substrates. Alternatively, the substrates may be connected to one another in aligning the substrates.

In the above structure, the processing means is a means for forming a pixel portion. The pixel portion mentioned here includes any elements constituting a pixel portion, e.g., a conductive film such as a wiring and an electrode, an insulating film such as an interlayer insulating film and a protection film, a light emitting layer such as an EL element, a liquid crystal and the like. Also, a driver circuit portion and the like provided in the periphery of a pixel region, a conductive film such as a wiring for connecting to a pixel portion and an insulating film covering the wiring and the like can be formed by the processing means. As the processing means, a droplet discharging method, various printing methods such as screen printing and gravure printing, or an atmospheric pressure plasma device can be employed. The droplet discharging method is a method of selectively discharging a droplet (also referred to as a dot) of a composition containing a material such as a conductive material and an insulating material to form a pattern in a predetermined portion. Depending on its system, the droplet discharging method is also referred to as an ink-jet method. Further, the sealing means includes at least mutually-opposing two rollers.

In another aspect of the invention, a method for manufacturing a display device includes the steps of: forming a separation layer over a substrate; forming an element formation portion that constitutes a part of the display device on the separation layer; forming an opening in the element formation portion to expose the separation layer therethrough; introducing an etching agent in the opening to remove the separation layer; adhering one surface of the element formation portion to a first sheet material and separating the element formation portion from the substrate; adhering the other surface of the element formation portion to a second sheet material and separating the element formation portion from the first sheet material; forming a pixel portion on the element formation portion using processing means; and adhering one surface of the element formation portion to a third sheet material to seal the element formation portion. Concretely, after forming a part of an element formation portion constituting a display device that is necessary to be formed by a heat treatment and the like over a substrate with rigidity in advance, the part of the element formation portion is separated from the substrate with rigidity and is transferred to a flexible substrate, and then the rest constituting the display device is formed.

In another aspect of the invention, a method for manufacturing a display device includes the steps of: forming a separation layer over a substrate; forming an element formation portion including a base insulating film formed on the separation layer, a semiconductor film having a channel region and source or drain regions formed on the base insulating film, a gate electrode formed over the channel region of the semiconductor film through an gate insulating film, an interlayer insulating film formed to cover the gate electrode, source or drain electrodes being electrically connected to the source or drain regions of the semiconductor film and a wiring formed on the interlayer insulating film, a pixel electrode being electrically connected to one of the source or drain electrodes, and an insulating film formed to cover an edge of the pixel electrode; forming an opening that reaches the separation layer in the insulating film, the interlayer insulating film, the gate insulating film and the base insulating film to expose the separation layer; introducing an etching agent in the opening to remove the separation layer; separating the element formation portion from the substrate by adhering a first sheet material to one surface of the element formation portion; separating the element formation portion from the first sheet material by adhering a second sheet material to the other surface of the element formation portion; forming a light emitting layer and a counter electrode over the pixel electrode using processing means; forming a protection film on the counter electrode; and adhering a third sheet material to the surface of the protection film to seal the element formation portion.

Also, in the above mentioned structure of the invention, a film-type display device may be manufactured as follows: after a structure that includes a base insulating film, a semiconductor film having a channel region and source or drain regions formed on the base insulating film and a gate insulating film is formed on a separation layer that is provided over a substrate prior to performing a separation treatment, the separation layer is removed to separate the structure from the substrate and the structure is transferred to a flexible substrate. Thereafter, remaining parts of the film-type display device are formed thereon. Alternatively, after forming a structure that includes a base insulating film, a semiconductor film having a channel region and a source or drain region formed on the base insulating film, a gate insulating film; a gate electrode formed over the channel region of the semiconductor film through the gate insulating film and an interlayer insulating film formed to cover the gate electrode is formed on a separation layer that is formed on a substrate prior to performing a separation treatment, the separation layer is removed and an opening that reaches the source or drain region of the semiconductor film is formed in the interlayer insulating film. Subsequently, after the thus-formed structure is separated from the substrate and transferred to a flexible substrate, remaining parts of the film-type display device may be formed to complete the film-type display device.

In another aspect of the invention, a method for manufacturing a display device includes the steps of: forming separation layers over a plurality of substrates, forming element formation portions constituting parts of the display device on the separation layers; forming openings in the element formation portions to exposed the separation layers; introducing an etching agent in the openings to remove the separation layers; aligning the plurality of substrates over which the element formation portions are provided respectively; separating the element formation portions from the plurality of substrates by adhering one surface of each of the element formation portions to a first sheet material; separating the element formation portions from the first sheet material by adhering the other surface of each of the pixel formation portions to a second sheet material; forming pixel portions over the element formation portions by using processing means; and adhering one surface of each of the element formation portions to a third sheet material to seal the element formation portions. In the above structure, this method can be applied to a case where element formation portions formed over a plurality of substrates have different structures from one another. In this case, one display device can be formed by combining the structures of the element formation portions having different functions.

In the above structure, the processing means is a means for forming a pixel portion. The pixel portion mentioned here includes any elements constituting a pixel portion, e.g., a conductive film such as a wiring and an electrode, an insulating film such as an interlayer insulating film and a protection film, a light emitting layer such as an EL element, a liquid crystal and the like. Also, a driver circuit portion and the like provided in the periphery of a pixel region, a conductive film such as a wiring connecting to a pixel portion and an insulating film covering the wiring and the like can be formed by the processing means. As the processing means, a droplet discharging method, various printing methods such as screen printing and gravure printing, or an atmospheric pressure plasma device can be employed.

By utilizing the apparatus for manufacturing a display device according to the present invention, a display device provided over a flexible substrate can be manufactured efficiently at low cost. Also, by utilizing the manufacturing method according to the invention, a display device including a thin film transistor with excellent characteristics can be obtained.

BRIEF DESCRIPTION OF THE DRAWINGS

FIGS. 1A and 1B are diagrams showing a process of manufacturing a display device according to the present invention;

FIGS. 6A to 6D are cross sectional views showing a method for manufacturing a display device according to the invention;

FIGS. 10A to 10D are cross sectional views showing a method for manufacturing a display device according to the invention;

FIGS. 13A to 13D are cross sectional views showing a method for manufacturing a display device according to the invention;

FIGS. 14A and 14B are cross sectional views showing a method for manufacturing a display device according to the invention;

FIGS. 16A to 16D are cross sectional views showing a method for manufacturing a display device according to the invention;

FIGS. 17A to 17D are cross sectional views showing a method for manufacturing a display device according to the invention;

FIGS. 22A to 22C are cross sectional views showing a method for manufacturing a display device according to the invention.

DETAILED DESCRIPTION OF THE PREFERRED EMBODIMENTS

Figure 2:
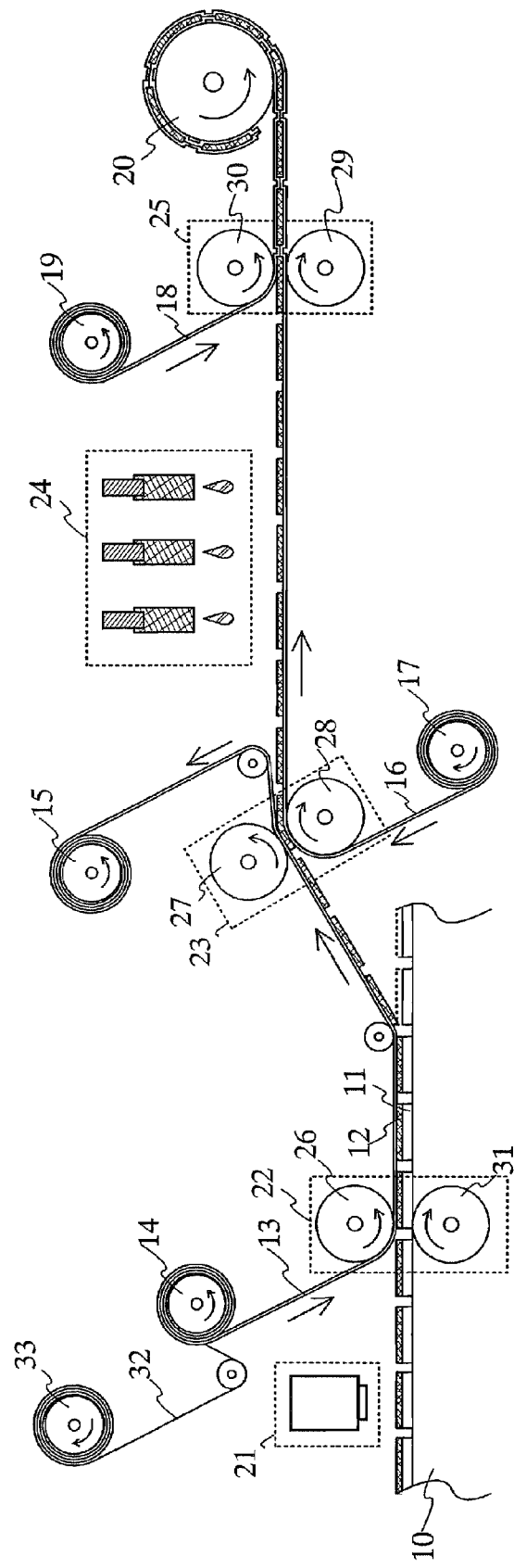
FIG. 2 is a diagram showing an apparatus for manufacturing a display device according to the invention.

The embodiment modes according to the present invention will hereinafter be described referring to the accompanying drawings. It is easily understood by those who skilled in the art that the embodiment modes and details herein disclosed can be modified in various ways without departing from the purpose and the scope of the invention. The present invention should not be interpreted as being limited to the description of the embodiment modes to be given below. Identical portions or portions having similar functions are marked by same reference numerals throughout the drawings.

In the present invention, at least a part of a display device is formed over a substrate with a rigidity such as glass, a part of the display device is separated from the substrate and is transferred to a flexible substrate, and then remaining a part of the display device are formed thereover to complete the display device. Schematic views thereof are shown in FIGS. 1A and 1B. Further, FIG. 1A shows a process of manufacturing the display device while FIG. 1B shows structures of the display device in respective steps.

As shown in FIG. 1A, an apparatus for manufacturing a display device proposed by the present invention comprises transferring means 100 for transferring a substrate over which an element formation portion 102 constituting the display device (hereinafter, referred to as the element formation portion 102) is provide; a first sheet material 103 with an adhesive layer at least on one surface thereof; a second sheet material 104 and a third sheet material 106 for sealing the display device. The apparatus for manufacturing the display device also includes controlling means 111 for controlling a position of the substrate 101, first separating means 112 for separating the element formation portion 102 from the substrate 101, second separating means 113 for separating the element formation portion 102 from the first sheet material 103, processing means 114 for forming one or both of a conductive film and an insulating film on the element formation portion 102, sealing means 115 for sealing the element formation portion 102, and the like. Further, the apparatus may arbitrarily includes all of these parts or a combination of some parts thereof.

In the apparatus as shown in FIG. 1A, the substrate 101 over which the element formation portion 102 is provided is at first transferred by the transferring means 100. At this time, the position of the substrate is adjusted by the controlling means 111. When element formation portions provided over a plurality of substrates are connected to one another to form one display device, the positions of the plurality of substrates are adjusted by the controlling means 111. In this case, the substrates may be bonded to one another.

As the controlling means 111 (used for adjusting the position of the substrate), a CCD (charge coupled device) camera and the like can be used. By aligning the plurality of substrates precisely, the element formation portions constituting the display device, which are provided over the plurality of substrates, can be connected to one another to complete a large size display device. Further, when one display device is formed by connecting a plurality of substrates to one another, a boundary line generated between the connected substrates in a pixel portion should be made unnoticeable in displaying an image on the display device. In the present invention, the boundary line therebetween can be made unnoticeable by placing a gap between pixels over the boundary line or by forming a wiring, an electrode, a light emitting layer, a liquid crystal or the like over the boundary line after connecting the substrates to each other.

Subsequently, the element formation portion 102 provided over the substrate 101 is adhered to the first sheet material 103, and then is separated the element formation portion from the substrate 101 by the first separating means 112. The element formation portion 102 separated from the substrate is carried to a next step while being adhered with the first sheet material 103. At the same time, the substrate 101 is retrieved and reused.

Next, the element formation portion 102, which is a thin film, being adhered with the first sheet material 103 is adhered to the second sheet material 104 and then is separated from the first sheet material 103 by the second separating means 113. The element formation portion 102 is carried to a next step while being adhered with the second sheet material 104.

Next, a wiring, a light emitting layer, an electrode and the like are formed on the surface of the element formation portion 102 adhered with the second sheet material 104 by the processing means 114. As the processing means 114, a means by which elements can be directly formed on the element formation portion 102 is preferably used. For instance, the droplet discharging method, various printing methods such as screen printing and gravure printing can be employed. By directly forming the wiring, the light emitting layer, the electrode and the like on the element formation portion 102 using the droplet discharging method or printing, the utilization efficiency of materials and the operating efficiency can be improved.

Subsequently, the third sheet material 106 is adhered to a surface of an element formation portion 105, which is processed by the processing means 114, by the sealing means 115 so as to seal the element formation portion 105 with the second sheet material 104 and the third sheet material 106.

According to the above described process, the display device can be manufactured. Further, using film-type sheet materials with flexibility as the second and third sheet materials makes it possible to manufacture a film-type display device. The method for manufacturing a display device and the apparatus for manufacturing the display device according to the present invention can be utilized in any type of display device such as a liquid crystal display device and a display device using a light emitting element. Additionally, the method for manufacturing a display device and the apparatus for manufacturing a display device according to the invention can be further applied to both an active matrix display device and a passive matrix display device.

Specific structures of the present invention will be described below with reference to the drawings.

Embodiment Mode 1

In Embodiment Mode 1, a more specific structure of the apparatus for manufacturing a display device as shown in FIG. 1A will be described with reference to the drawings.

As shown in FIG. 2, an apparatus of Embodiment Mode 1 comprises transferring means 10 for transferring a substrate 11 over which an element formation portion 12 constituting a part of the display device (hereinafter referred to as the element formation portion 12) is provided; controlling means 21 for controlling a position of the substrate 11; a first supply roll 14 to which a first sheet material 13 is reeled; first separating means 22 including a roller 26 that is used for attaching the first sheet material 13 to the element formation portion 12 and separating the element formation portion from the substrate 11; a second supply roll 17 to which a second sheet material 16 is reeled; second separating means 23 including rollers 27 and 28 that are used for attaching the second sheet material 16 to the element formation portion 12 and separating the element formation portion from the first sheet material 13; a collection roll 15 for collecting the first sheet material 13; processing means 24 for forming a pixel portion on the element formation portion 12; a third supply roll 19 for supplying a third sheet material 18; sealing means 25 for sealing the element formation portion processed by the processing means with the second sheet material 16 and the third sheet material 18; and a collection roll 20 to which the sealed element formation portion 12 is reeled. The overall course of manufacturing a display device will be described below.

At first, the element formation portion 12 provided over the substrate 11 is transferred by the transferring means 10. The position of the substrate over which the element formation portion 12 transferred is provided is adjusted by the controlling means 21. The substrate is then carried toward the roller 26. In the case where an accurate alignment of the substrate is not required, the controlling means 21 for controlling the position may not be provided. Further, when element formation portions formed over a plurality of substrates are connected to one another to complete a display device, the positions of the substrates are adjusted by the controlling means 21 to connect the substrates one another precisely.

Next, the first sheet material 13 supplied from the first supply roll 14 is attached to the element formation portion 12 provided over the substrate 11 by the first separating means 22 including the roller 26, and then the element formation portion 12 is separated from the substrate 11. Thereafter, the element formation portion 12 separated from the substrate is carried toward the roller 27 while being attached with the first sheet material 13. Also, the second sheet material 16 supplied from the second supply roll 17 is carried in a direction of the roller 28.

Subsequently, the second sheet material 16 is adhered to the surface of the element formation portion 12, which is transferred while being attached with the first sheet material 13, by the second separating means 23 including the rollers 27 and 28 to separate the element formation portion 12 from the first sheet material 13. Further, one or both of a pressure treatment and a heat treatment is/are carried out by the second separating means 23 in adhering the second sheet material 16 to the element formation portion 12, which is also attached with the first sheet material 13. Thereafter, the element formation portion 12 separated from the first sheet material 13 is carried toward the processing means 24 while being attached with the second sheet material 16.

A pixel portion is formed on the element formation portion 12, which is transferred from the second separation means 23, by the processing means 24. Any element constituting a pixel portion, e.g., a conductive film, an insulating film, a light emitting layer such as an organic EL element, a liquid crystal and the like can be formed by the processing means. In the processing means 24, the droplet discharging method in which a pattern is directly formed by discharging (jetting) a composition containing a conductive material, an insulating material, a semiconductor material or the like, the printing method such as screen printing and a gravure printing, an atmospheric pressure plasma device, and the like can be employed. Thereafter, the element formation portion on which the pixel portion is formed is carried toward the sealing means 25. Also, the third sheet material 18 supplied from the third supply roll 19 is carried toward the roller 30.

In the sealing means 25, the surface of the element formation portion, which is transferred while being adhered with the second sheet material, is adhered to the third sheet material 18 so that the element formation portion is sandwiched between the second and third sheet materials. At the same time, the element formation portion sandwiched therebetween is subjected to one or both of a pressure treatment and a heat treatment. Thereafter, the element formation portion sandwiched (sealed) with the second and third sheet materials is carried toward the collection roll 20 is reeled onto the collection roll 20.

As mentioned above, in the apparatus as shown in FIG. 2, the first sheet material 13 is supplied from the first supply roll 14, carried through the rollers 26 and 27 included in the first separating means 22 in this order, and then is collected in the collection roll 15. The first supply roll 14, the roller 26 and the roller 27 are rotated in the same direction. The second sheet material 16 supplied from the second supply roll 17 is carried through the roller 28 included in the second separating means 23 and the roller 29 included in the sealing means 25 in this order, and then the second material 16 is collected in the collection roll 20. Further, the second supply roll 17, the roller 28 and the roller 29 are rotated in the same direction. The third sheet material 18 is supplied from the third supply roll 19. This third sheet material is carried through the roller 30 included in the sealing means 25 and then is collected in the collection roll 20. The third supply roll 19 and the roller 30 are rotated in the same direction.

The transferring means 10 transfers the substrate 11 over which the element formation portion 12 is formed. In FIG. 2, the transferring means comprises a roller 31. By rotating the roller 31, the substrate 11 is transferred. Further, the transferring means 10 may includes any structure that can transfer the substrate 11. For example, a belt conveyor, a plurality of rollers, a plurality of robot arms and the like can be employed. The robot arms directly transfer the substrate 11 or transfer a stage over which the substrate 11 is loaded. Further, the transferring means 10 transfers the substrate 11 at a predetermined speed in accordance with the speed of moving the first sheet material 13.

The first sheet material 13, the second sheet material 16 and the third sheet material 18 are reeled onto the first supply roll 14, the second supply roll 17 and the third supply roll 19, respectively. By rotating the first supply roll 14 at a predetermined speed, the first sheet material 13 is carried at the predetermined speed in the direction of the roller 27 included in the second separating means. By rotating the second and third supply rolls 17 and 19 at the predetermined speed, respectively, the second and third sheet materials 16 and 18 are carried at the predetermined speed toward the sealing means 25, respectively. The first, second and third supply rolls 14, 17 and 19 have columnar shapes and are made from a resin material, a metal material, a rubber material and the like.

The first sheet material 13 is made from a flexible film, and has at least one surface pasted with an adhesive agent. Concretely, the adhesive agent is provided on a base film used as a base material such as polyester. As the adhesive agent, a material including a resin material that contains acrylic resin and the like or a synthetic rubber material can be employed. As the first sheet material 13, a film having low adhesion (where the adhesion is preferably 0.01 to 1.0 N, and more preferably, 0.05 to 0.5 N) is preferably used. This is because after adhering the element formation portion provided over the substrate to the first sheet material, the second sheet material is attached to the element formation portion so as to separate the first sheet material from the element formation portion. The thickness of the adhesive agent can be set to be 1 to 100 μm, and more preferably, 1 to 30 μm. As the base film, a film made from polyester or the like is preferably formed with a thickness of 10 μm to 1 mm to process it easily.

When a surface of an adhesive layer is protected with a separator 32, a separator collection roll 33 may be provided as shown in FIG. 2, and the separator 32 may be removed from the adhesive layer in use. Further, a base film that is subjected to an antistatic treatment can be used as the base material. The separator is formed using a film such as polyester, a paper or the like. A separator formed using a film such as polyethylene terephthalate or the like is preferably used since paper powders and the like are not caused in processing.

The second sheet material 16 and the third sheet material 18 are formed using flexible films. For instance, a laminate film, a paper made from a fibrous material, and the like can be used. The laminate film indicates to all films that can be used for a sealing treatment such as a laminating treatment. The laminate film is made from a material such as polypropylene, polystyrene, polyester, vinyl, polyvinyl fluoride, vinyl chloride, methyl methacrylate, nylon and polycarbonate, and the surface thereof may be subjected to a processing treatment such as embossing.

In this embodiment mode, the element formation portion is preferably sealed using a hot-melt adhesive agent. The hot-melt adhesive agent does not contain water and a solution and is made form a volatile thermoplastic material that is solid at room temperature. The hot-melt adhesive agent is a chemical substance that can be applied in a molten state and can attach goods to each other by being cooled. Furthermore, the hot-melt adhesive agent has advantages of short adhering time, non pollution, safety, good hygiene, energy saving, low cost and the like.

Since the hot-melt adhesive agent is solid at room temperature, a hot-melt adhesive agent that is processed into a film form or a fibrous form in advance, or a base film such as polyester over which an adhesive layer is provided in advance can be used. Here, a sheet material, in which a hot-melt film is formed on a base film made from polyethylene terephthalate, is used. The hot-melt film is made from resin having a lower softening point than that of the base film. By heating the sheet material, only the hot-melt film is melted to be in a rubbery state and is adhered. When cooling this sheet material, the hot-melt film is cured. Further, for example, a film mainly containing ethylene-vinyl acetate copolymer (EVA), polyester, polyamide, thermoplastic elastomer, polyolefin or the like can be used as the hot-melt film.

Further, one or both of the second sheet material 16 and the third sheet material 18 may have an adhesive surface. The adhesive surface may be formed by applying an adhesive agent such as heat-curing resin, ultraviolet-curing resin, an epoxy rein adhesive agent, a light-curing adhesive agent, a moisture-curing adhesive agent and a resin additive agent.

Also, one or both of the second sheet material 16 and the third sheet material 18 may have a light transmitting property. Also, one or both of the second and third sheet materials 16 and 18 may be coated with a thin film mainly containing carbon (e.g., a diamond like carbon film) or a conductive material such as indium tin oxide (ITO) as a protection film. In addition, films that are subjected to an antistatic treatment for preventing static charge and the like (hereinafter, antistatic films) can be used as the second and third sheet materials 16 and 18. As the antistatic films, a film in which an antistatic material is dispersed in resin, a film adhered with an antistatic material, and the like can be given. With respect to the film provided with the antistatic material, an antistatic material may be provided on one surface of the film or antistatic materials may be provided on both surfaces of the film. Further, a film where an antistatic material is provided on one surface thereof may be attached to a layer such that the surface provided with the antistatic material is in contact with the layer. Alternatively, the film where the antistatic material is provided on one surface thereof may be attached to a layer such that the other surface of the film, which is opposite from the surface adhered with the antistatic material, is in contact with the layer. Furthermore, an antistatic material may be provided on an entire surface or a part of a film. As the antistatic material, metal, indium tin oxide (ITO), surface active agents such as an ampholytic surface active agent, a cationic surface active agent, and a nonionic surface active agent can be used. In addition, a resin material containing a cross-linked copolymer polymer that has a carboxyl group and a quaternary ammonium base in side chains and the like can be used as the antistatic material. By attaching or applying these materials to a film or by kneading them into a film, antistatic films can be formed. By sealing an element formation portion with the antistatic films, the element formation portion can be prevented from being damaged by static charge and the like of an external portion when dealing the semiconductor element as a product.

The controlling means 21 controls a position of the transferred substrate 11. In FIG. 2, the substrate 11 is aligned by using a CCD camera. Also, a display device where a plurality of substrates are connected to one another can be manufactured by controlling the positions of the plurality of substrates accurately. At this moment, the positions of the plurality of substrates are controlled accurately using the controlling means 21 to connect the substrates to one another. In the case where a boundary line between the connected substrates is formed in a pixel portion, the boundary line should be made unnoticeable. In this embodiment mode, the plurality of substrates can be aligned accurately by the controlling means 21 and then be connected to one another. Thereafter, a wiring, an electrode or a light emitting layer can be formed thereover by the processing means 24, and hence, a boundary line between the connected substrates can be made more unnoticeable. Further, when the substrates are not necessary to be aligned accurately, the controlling means 21 may not be provided.

The first separating means 22 comprises at least the roller 26. By using the first separating means 22, one surface of the element formation portion 12 is adhered to one surface of the first sheet material 13, and then the element formation portion 12 is separated from the substrate 11. Concretely, by rotating the roller 26, the element formation portion 12 is adhered to the first sheet material 13 and the element formation portion 12 is separated from the substrate 11. Accordingly, the roller 26 is placed to face the element formation portion 12, which is provided over the substrate 11. The roller 26 has a columnar shape and is made from a resin material, a metal material, a rubber material or the like. Preferably, the roller 26 is made from a soft material.

The second separating means 23 comprises at least the mutually-facing rollers 27 and 28. By using the second separating means 23, the element formation portion 12 adhered with the first sheet material 13 is adhered to one surface of the second sheet material 16 and then the element formation portion 12 is separated from the first sheet material 13. At this moment, while adhering the element formation portion to the second sheet material 16 carried toward the roller 28 from the second supply roll 17, one or both of a pressure treatment and a heat treatment is/are carried out by using one or both of the rollers 27 and 28 when the element formation portion passes between the rollers 27 and 28.

By carrying out one or both of the pressure treatment and the heat treatment, the element formation portion 12 adhered with the first sheet material 13 is adhered to the second sheet material 16. As the heat treatment, any technique by which the heat energy can be applied can be employed. For example, heat mediums such as an oven, a heater of an electrically-heated wire and an oil, a hot stamp, a thermal head, laser light, infrared flash, a heat pen, and the like can be selected arbitrarily. Further, the rollers 27 and 28 have columnar shapes and are made from a resin material, a metal material, a rubber material and the like. Preferably, the rollers are formed using a soft material.

By using the processing means 24, a pixel portion is formed on the surface of the element formation portion 12 adhered with the second sheet material 16. Concretely, elements necessary to complete pixels of a display device, e.g., a conductive film such as a wiring and an electrode, an insulating film, a light emitting layer, a liquid crystal and the like are formed. As the processing means, the droplet discharging method, in which a composition containing a conductive material, an insulating material or the like is discharged (jetted) to form a pattern directly, the printing methods such as screen printing and gravure printing, in which a material is provided over an original plate and a pattern is transferred, can be employed. This embodiment mode shows a case of using the droplet discharging method. For example, when a semiconductor film, a gate electrode, a wiring, a pixel electrode and the like are provided over the substrate 11 in advance, droplets are selectively discharged using the processing means 24 to form a light emitting element, a counter electrode and the like. Alternatively, only a semiconductor layer is formed over the substrate 11 in advance, and then a gate electrode layer, a wiring, a pixel electrode, a light emitting layer, a counter electrode and the like may be formed by using the processing means 24. The elements to be formed by the processing means can be arbitrarily selected by an operator.

Since the element formation portion 12, which is separated from the substrate 11 by the first separating means 22, is further separated from the first sheet material by the second separating means, the surface of the element formation portion 12 that is carried to the processing means 24 is identical to the surface of the element formation portion that is formed over the substrate 11. Therefore, by performing the separating treatment twice, a light emitting layer and the like can be formed on the element formation portion efficiently.

When the element formation portion processed by the processing means 24 is carried to the sealing means 25, the third sheet material 18 is adhered to the surface of the element formation portion to seal the element formation portion with the second and third sheet materials 16 and 18. The sealing means 25 comprises the mutually-facing rollers 29 and 30. Concretely, the other surface of the element formation portion is adhered to the third sheet material 18 that is carried toward the roller 30 from the third supply roll 19. At the same time, while the element formation portion passes between the rollers 29 and 30, one or both of a pressure treatment and a heat treatment is/are performed using the rollers 29 and 30. By performing one or both of the pressure treatment and the heat treatment, the element formation portion is sealed with the second sheet material 16 and the third sheet material 18.

One or both of the rollers 29 and 30 included in the sealing means 25 has/have heating means. As the heating means, for example, heat mediums such as an oven, a heater of an electrically-heated wire and an oil, a hot stamp, a thermal head, laser light, infrared flash, a heat pen, and the like can used. Further, the rollers 29 and 30 are rotated at a predetermined speed in accordance with the speed of rotating the roller 28, the second supply roll 17 and the third supply roll 19. The rollers 29 and 30 have columnar shapes, and are made from a resin material, a metal material, a rubber material and the like. Preferably, the rollers are formed using soft materials.

The collection roll 20 collects the element formation portion, which is sealed with the second and third sheet materials 16 and 18 where the element formation portion is reeled onto the collection roll. The collection roll 20 is rotated at a predetermined speed in accordance with the speed of rotating the rollers 29 and 30. The collection roll 20 has a columnar shape and is made from a resin material, a metal material, a rubber material or the like. Preferably, the collection roller is made from a soft material.

According to the apparatus as shown in FIG. 2, by rotating the first, second and third supply rolls 14, 15 and 21, the rollers 26, 31, 27, 28, 29 and 30, and the collection roll 20, the element formation portion 12 provided over the substrate 11 can be successively separated, sealed and collected. Therefore, the apparatus as shown in FIG. 2 can increase the productivity and a manufacturing efficiency.

Next, another apparatus for manufacturing a film-type display device having a different structure from that of the above-described apparatus will be described with reference to FIG. 3.

Figure 3:
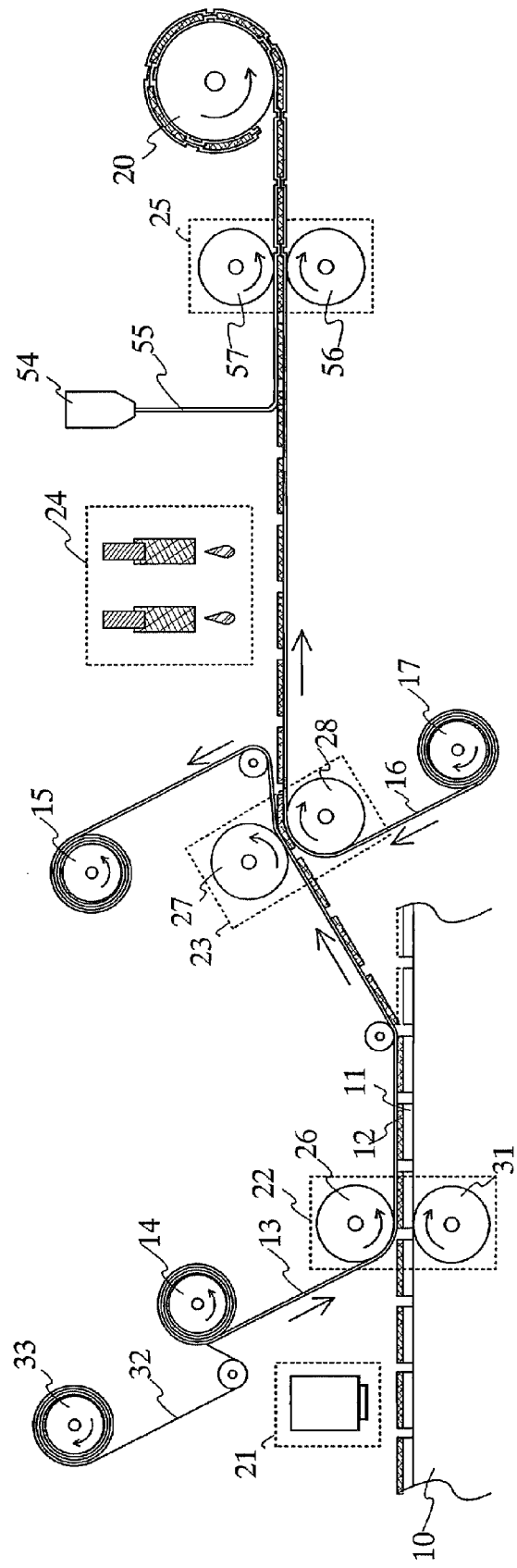
FIG. 3 is a diagram showing an apparatus for manufacturing a display device according to the invention.

The apparatus as shown in FIG. 3 comprises: transferring means 10 for transferring a substrate 11 over which an element formation portion 12 is provided; controlling means 21 for controlling a position of the substrate 11; a first supply roll 14 to which a first sheet material 13 is coiled; first separating means 22 including a roller 26 that is used for adhering the first sheet material 13 to the element formation portion 12 and separating the element formation portion from the substrate 11; a second supply roll 17 on which a second sheet material 16 is coiled; second separating means 23 that are used for attaching the second sheet material 16 to the element formation portion 12 and separating the element formation portion 12 from the first sheet material 13; a collection roll 15 for collecting the first sheet material 13; processing means 24 for forming a pixel portion on the element formation portion 12; sealing means 25 for sealing the element formation portion 12 with the second sheet material 16 and resin 55 by pushing out the resin 55 in a heated molten state to a surface of the element formation portion 12 where is an opposite side of the surface thereof to which the second sheet material 16 is adhered; and a collection roll 20 to which the sealed element formation portion 12 is coiled. The structure as shown in FIG. 3 is similar to that of FIG. 2, except that the third supply roll 19 and the third sheet material 18 are replaced by the die 54 and the resin 55.

In the apparatus as shown in FIG. 3, the element formation portion 12 provided over the substrate 11 is separated from the substrate by using the first sheet material 13, the element formation portion 12 adhered with the first sheet material is adhered to the second sheet material 16, the element formation portion 12 adhered with the second sheet material 16 is processed by the processing means 24, and then the element formation portion is carried toward the sealing means 25 in the same manner as FIG. 1A. Thereafter, in FIG. 3, the resin 55, which is pushed out from the die 54 while being in the heated molten state, is applied to the surface of the element formation portion, where is opposite from the surface adhered with the second sheet material 16, from the die 54. Subsequently, the second sheet material 16 and the resin 55 introduced between a pressure bonding roller 56 and a cooling roller 57 is pressed and cooled using the pressure bonding roller 56 and the cooling roller 57 to adhere the resin 55 to the surface of the element formation portion. Thus, the element formation portion 12 is sealed with the second sheet material 16 and the resin 55. Finally, the sealed element formation portion 12 is carried toward the collection roll 20, and then is collected in the collection roll 20 where the sealed element formation portion is reeled onto the collection roll.

In the laminating machine as illustrated in FIG. 3, thermoplastic resin may be used as the resin 55. Thermoplastic resin having a low softening point is preferably used as the resin 55. For example, polyolefin-based resin such as polyethylene, polypropylene and polymethylpentene; vinyl-based copolymer such as vinyl chloride, vinyl acetate, vinyl chloride-vinyl acetate copolymer, ethylene-vinyl acetate copolymer, vinylidene chloride, polyvinyl butyral and polyvinyl alcohol; acrylic resin; polyester resin; urethane resin; cellulose-based resin such as cellulose, cellulose acetate, cellulose acetate butyrate, cellulose acetate propionate and ethylcellulose; styrene resin such as polystyrene and acrylonitrile-styrene copolymer; and the like can be given. Further, the resin 55 may be pushed out from the die 54 to have a single layer or two or more layers. Further, the above-mentioned materials can be used as the first sheet material 13 or the second sheet material 16.

According to the apparatus as shown in FIG. 3, by rotating the transferring means 10, the first and second supply rolls 14 and 17, the rollers 26, 27 and 28, the pressure bonding roller 56, the cooling roller 57 and the collection roll 20, the element formation portion 12 provided over the substrate 11 can be successively separated, sealed and then collected. Therefore, the apparatus as shown in FIG. 3 can increase the productivity and improve the manufacturing efficiency.

Figure 4:
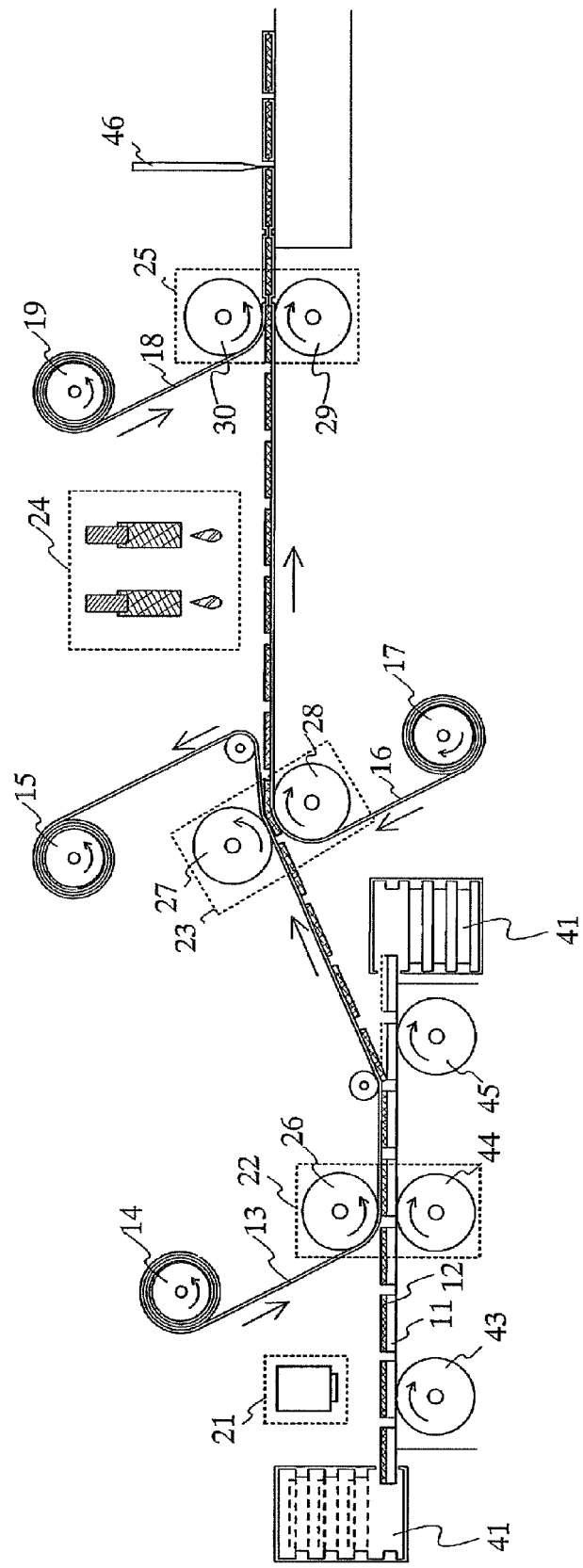
FIG. 4 is a diagram showing an apparatus for manufacturing a display device according to the invention.

Next, another apparatus for manufacturing a film-type display device having a different structure of those of the above-described apparatuses will be described with reference to FIG. 4.

A cassette 41 is a cassette for supplying substrates, in which substrates 11 over which a plurality of element formation portions 12 are formed are set. A cassette 42 is a cassette for retrieving the substrates. After separating the element formation portions 12 from the substrates 11, the substrates are retrieved in the cassette 42. A plurality of rollers 43, 44 and 45 are provided as transferring means between the cassettes 41 and 42. By rotating the rollers 43, 44 and 45, the substrates 11 are transferred.

Afterwards, as described above, the element formation portions 12 are separated from the substrates 11 and sealed with the sealing materials. Subsequently, the sealed element formation portions 12 are cut by cutting means 46. The cutting means 46 employs a dicing apparatus, a scribing apparatus, a laser irradiating apparatus (e.g., a $CO_2$ laser irradiating apparatus and the like) or the like. According to the above described process, the sealed element formation portions 12 are completed.

In this embodiment mode, the substrates 11 from which the element formation portions are separated can be reused. Therefore, the cost can be reduced even in the case of using a quartz substrate, where the initial cost thereof is higher than that of a glass substrate. When using the quartz substrate, the conditions of manufacturing process depending on a kind of substrate can be eased as compared with the case of using a glass substrate, and therefore, a display device having more excellent characteristics can be formed. Further, in the case of reusing the substrates, the apparatus is preferably controlled so as not to cause scratches on the substrates in the separation treatment. However, even when the substrates are scratched, an organic film or an inorganic film may be formed on the surfaces thereof by coating or by the droplet discharging method, or, the surfaces thereof may be subjected to a planarizing treatment by grinding or polishing.

As described above, a flexible display device can be manufactured efficiently by utilizing the apparatuses as described in this embodiment mode.

Embodiment Mode 2

Next, a specific example of a method for manufacturing a display device will be described with reference to the drawings.

In this embodiment mode, some parts of a display device are formed in advance over a heat-resistant substrate such as glass. The parts of the display device formed over the substrate are separated form the substrate and then are attached to a flexible substrate. Remaining parts of the display device is then formed over the flexible substrate.

Figure 5A:
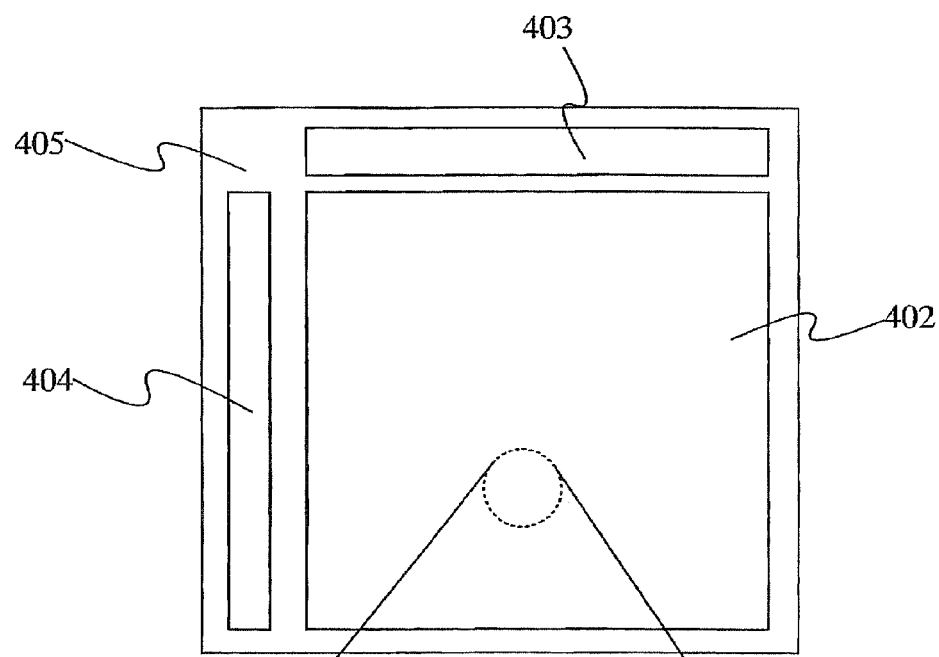
FIGS. 5A and 5B are diagrams showing a structure of a pixel region of a display device according to the invention.

As shown in a schematic view of the display device of FIG. 5A, a pixel region 402 including a plurality of pixel portions, driver circuits 403 and 404 for driving the pixel portions are generally provided over a substrate 200 such as a glass substrate. In addition, a circuit for controlling the pixel portions is provided over the substrate 200 or outside of the substrate 200 while being electrically connected to the pixel portions.

In this embodiment mode, after forming some parts of a structure of the display device over the substrate 200, the parts of the structure of the display device are separated from the substrate 200 and transferred to a flexible substrate, rather than completing a whole structure of the display device over the substrate 200. Afterwards, remaining parts of the structure of the display device are formed over the flexible substrate. More specific process of manufacturing the display device will be described below with reference to FIGS. 6A to 6D and FIGS. 7A to 7C.

Figure 5B:
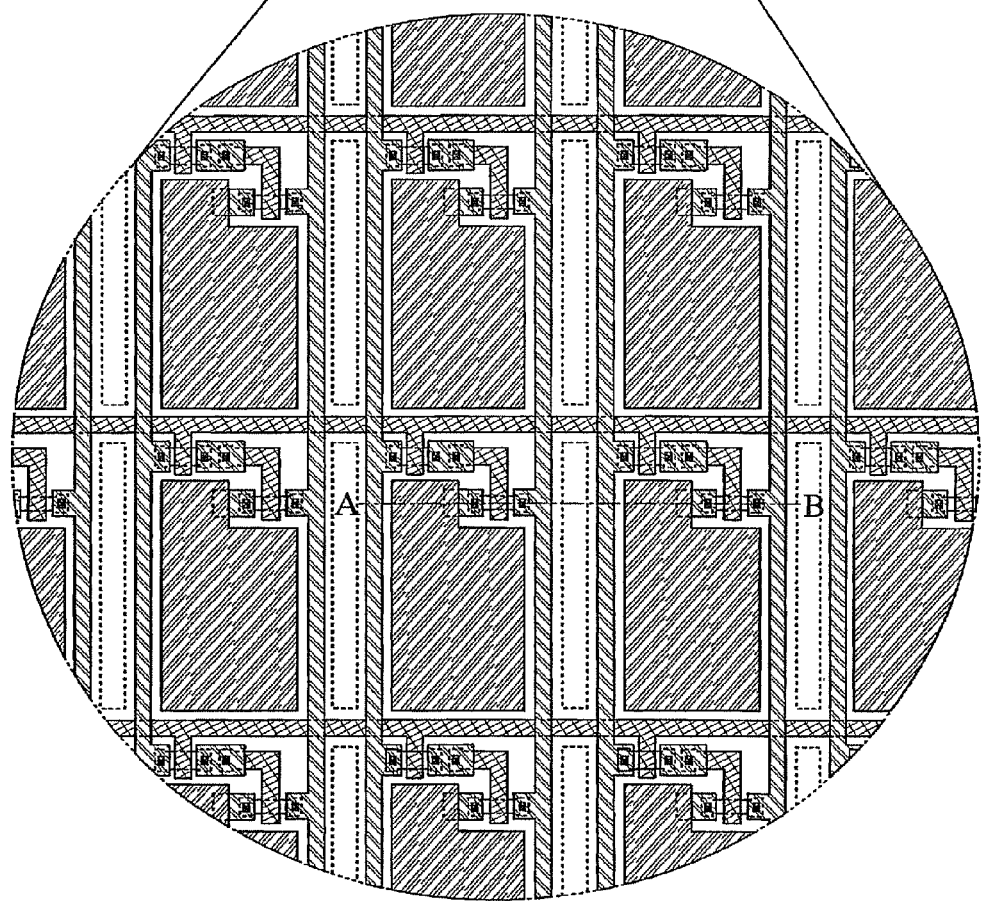

As shown in FIG. 6A, a separation layer 201, a first insulating film 202, a second insulating film 203, a semiconductor film 204, a gate insulating film 205, a gate electrode 206, an interlayer insulating film 207, source or drain electrodes 208 and 209, a pixel electrode 210, a wiring 211 and a partition wall 212 are provided over the substrate 200. Further, cross sectional views as shown in FIGS. 6A to 6D corresponds to a cross section taken along a line A-B of FIG. 5B. A structure of FIG. 6A will hereinafter be described in more detail.

As the substrate 200, for example, a glass substrate such as barium borosilicate glass and alumino borosilicate glass, a quartz substrate, a ceramic substrate, or the like can be used. Also, a metal substrate including stainless or a semiconductor substrate on which an insulating film is formed may be used. The surface of the substrate 200 may be planarized in advance by polishing such as CMP.

As the separation layer 201 formed on the substrate 200, a metal film including tungsten (W), molybdenum (Mo), niobium (Ni) or titanium (Ti), or a semiconductor film including silicon (Si) or the like is formed. In this embodiment mode, a metal film containing W is formed as the separation layer 201. Further, the metal film containing W can be formed by CVD, sputtering, or electron beam or the like. The metal film containing W is formed by sputtering here. Also, a metal film (e.g., W) on which a metal oxide film (e.g., $WO_x$) is laminated may be used as the separation layer 201. In addition, as a combination of a metal film and a metal oxide film, a combination of Mo and MoOx, a combination of Nb and NbOx, a combination of Ti and TiOx (x=2 to 3), and the like can be used.

Although the separation layer 201 is directly formed on the surface of the substrate 200 in FIG. 6A, a base film may be provided between the substrate 200 and the separation layer 201. The base film can be formed using a single layer structure of an insulating film containing oxygen or nitrogen such as silicon oxide (SiOx), silicon nitride (SiNx), silicon oxynitride (SiOxNy) (x>y) and silicon nitride oxide (SiNxOy) (x>y), or a lamination structure thereof. In particular, when there is a possibility of contaminations through the substrate, the base film is preferably provided between the substrate 200 and the separation layer 201.

After forming the separation layer 201 over the substrate 200, an insulating film is formed on the separation layer 201. The insulating film can include a single layer structure or a lamination structure. In FIG. 6A, the insulating film has a lamination structure including a first insulating film 202 and a second insulating film 203. As the insulating film, for example, a silicon oxide film is used as the first insulating film 202 while a silicon oxynitride film is used as the second insulating film 203. Alternatively, a three layer structure that includes a first insulating film made from a silicon oxide film, a second insulating film made from a silicon nitride oxide film and a third insulating film made from a silicon oxynitride film can be used.

Subsequently, a thin film transistor is formed on the second insulating film 203. This thin film transistor at least comprises the semiconductor film 204 that is patterned into a desired shape, the gate electrode 206 that is formed through the gate insulating film 205, the interlayer insulating film 207, and the source or drain electrodes 208 and 209 that are electrically connected to the semiconductor film 204.

The semiconductor film 204 may have any state selected from an amorphous semiconductor, an SAS in which an amorphous state and a crystalline state are mixed, a microcrystalline semiconductor in which 0.5 to 20 nm crystal grains can be observed in the amorphous semiconductor, and a crystalline semiconductor. When using a substrate that can withstand a processing temperature, e.g., a quartz substrate, a crystalline semiconductor film may be formed on the substrate by CVD or the like.

In this embodiment mode, an amorphous semiconductor film is formed and is crystallized by a heat treatment to form a crystalline semiconductor film. As the heat treatment, a heating furnace, laser irradiation, irradiation of light emitted from a lamp instead of laser beam (lamp annealing), or a combination thereof can be used.

The gate insulating film 205 is formed to cover the semiconductor film 204. As the gate insulating film 205, for example, a single layer or plural layers using silicon oxide, silicon nitride, silicon nitride oxide and the like can be formed. The gate insulating film 205 can be formed by plasma CVD, sputtering or the like.

The gate electrode 206 is formed on the gate insulating film 205. For instance, the gate electrode 206 can be formed using an element selected from Ta, W, Ti, Mo, Al, Cu, Cr and Nd, or an alloy material or a compound material mainly containing the above elements. Alternatively, a semiconductor film typified by a polycrystalline silicon film doped with an impurity element such as phosphorus may be used as the gate electrode. In addition, an AgPdCu alloy can be used. Further, a combination of the above-mentioned materials may be used as the gate electrode. This gate electrode 206 may include either a single layer structure or a lamination structure having a plurality of layers.

Next, while utilizing the gate electrode or a pattern made from resist as a mask, an impurity element imparting an n-type or a p-type conductivity is selectively added into the semiconductor film 204. The semiconductor film 204 includes a channel formation region and an impurity region (including a source region, a drain region, a GOLD region and an LDD region, for example). An n-channel TFT or a p-channel TFT can be selectively formed depending on a conductivity type of an impurity element to be added thereinto. In addition, a side wall may be formed at a side of the gate electrode 260.

Subsequently, the interlayer insulating film 207 is formed. As the interlayer insulating film 207, an inorganic insulating film or an organic insulating film can be used. As the inorganic insulating film, a silicon oxide film or a silicon oxynitride film formed by CVD, a silicon oxide film applied by the SOG (spin on glass) method, or the like can be used. As the organic insulating film, a film made from polyimide, polyamide, BCB (benzocyclobutene), acrylic, positive type photosensitive organic resin, negative type photosensitive organic resin, or the like can be used. Additionally, a lamination structure of an acrylic film and a silicon oxynitride film may be employed.

As the interlayer insulating film, siloxane resin can be used. The siloxane resin corresponds to resin containing Si—O—Si bonds. The siloxane includes skeleton that is formed with bonds of silicon (Si) and oxygen (O). As a substituent of the siloxane, an organic group that includes at least hydrogen (for example, alkyl group or aromatic hydrocarbon) is used. Also, a fluoro group may be used as its substituent. Further, an organic group including at least hydrogen and a fluoro group may be used as its substituent.

The siloxane resin can be classified into, for example, silica glass, alkyl siloxane polymer, alkyl silsesquioxane polymer, hydrogenated silsesquioxane polymer, hydrogenated alkyl silsesquioxane polymer and the like depending on its structure. Further, the interlayer insulating film can be formed using a material that contains polymer (polysilazane) with Si—N bonds.

By using the above-mentioned materials, an interlayer insulating film having a sufficient flatness and insulating property can be obtained even if it has a thin thickness. Also, since the above-mentioned materials have high heat resistant properties, an interlayer insulating film capable of withstanding a reflow treatment that is performed for a multilayer wiring can be obtained. Furthermore, these materials have low hygroscopic properties, an interlayer insulating film with a small amount of dehydration can be formed.

Next, the interlayer insulating film 207 is etched to form contact holes that reach the source or drain regions of the semiconductor film 204. Subsequently, the source or drain electrodes 208 and 209 that are electrically connected to the source or the drain regions respectively and the wiring 211 are formed. The source or drain electrodes 208 and 209 and the wiring 211 can be formed using a single layer made from one kind of elements selected from Al, Ni, C, W, Mo, Ti, Pt, Cu, Ta, Au and Mn or an alloy containing these plural elements, or a lamination structure thereof. For instance, a lamination film including a Ti film and an alloy film that contains Al and Ti can be patterned to form the source or drain electrode layers and the wiring. Of course, they include single layer structure or a lamination structure having three or more layers, instead of the two layer structure.

Next, the pixel electrode 210 is formed on the interlayer insulating film 207. The pixel electrode 210 is formed to be electrically connected to the source or drain electrode 208. Further, the pixel electrode 210 is formed after forming the source or drain electrode 208 in FIG. 6A. Alternatively, the source or drain electrode 208 may be formed after forming the pixel electrode 210.

In the case where the pixel electrode 210 is used as an anode, a material with a large work function is preferably used. For example, a single layer of an ITO (indium tin oxide) film, an IZO (indium zinc oxide) film, a titanium nitride film, a chromium film, a tungsten film, a Zn film, a Pt film or the like can be used. In addition, a lamination layer of a titanium nitride film and a film mainly containing aluminum, a three layer structure of a titanium nitride film, a film mainly containing aluminum and a titanium nitride film, and the like can be used as the pixel electrode. When the pixel electrode is formed to have a lamination structure, the pixel electrode has low resistivity as a wiring along with a favorable ohmic contact. Such pixel electrode can serves as an anode.

Meanwhile, in the case where the pixel electrode 210 is used as a cathode, a material with a low work function is preferably used. For example, Al, Ag, Li and Ca, or an alloy thereof such as MgAg, MgIn, and Al—Li, and the like can be used. Further, in order to pass light through the pixel electrode 210, the pixel electrode 210 is preferably formed using a lamination layer of a thin metal film and a transparent conductive film (such as ITO (indium tin oxide), indium oxide-zinc oxide alloy ($In_2O_3$—ZnO) and zinc oxide (ZnO)).

Next, an insulating film is selectively formed to cover the source or drain electrodes 208 and 209, the wiring 211 and the edges of the pixel electrode 210 so as to form the partition wall 212 (hereinafter, also referred to as an insulating film 212). As the partition wall 212, an organic material such as acrylic and polyamide, silicon oxide, silicon oxynitride, siloxane resin and the like can be used. Preferably, the partition wall is formed to have a shape where a radius of curvature is continuously varied so as not to adversely affect a light emitting layer that will be formed to cover the pixel electrode 210.

According to the above process, the structure as shown in FIG. 6A can be formed.

Next, an opening 213 for introducing an etching agent thereinto is selectively formed except in a portion where the thin film transistor and the wiring are formed (FIG. 6B). The opening 213 is formed to expose the separation layer 201 by partly removing the insulating film 212, the interlayer insulating film 207, the gate insulating film 205, the first insulating film 202, and the second insulating film 203.

Subsequently, an etching agent is introduced into the opening 213 to remove the separation layer 201. In this embodiment mode, the etching agent chemically reacts with the separation layer 201 to remove the separation layer. The separation layer 201 may be completely removed. However, the separation layer 201 is not completely removed here, and at least a part of the separation layer existing under the pixel electrode 210 is left (FIG. 6C). The amount of a remnant of the separation layer can be controlled by setting an etching rate and reaction time in consideration of the reaction of the separation layer and the etching agent. By leaving the separation layer 201, an element formation portion 215 constituting parts of the display device (hereinafter, referred to as the element formation portion 215) can be prevented from being separated from the substrate 200 completely, even after removing the separation layer 201.

As the etching agent, a gas or a liquid containing halogen fluoride (an interhalogen compound) that easily reacts with the separation layer can be used. In the case of using a W film as the separation layer 201, for example, gaseous chlorine trifluoride ($ClF_3$) that easily reacts with W is preferably used. Also, as the etching agent, $CF_4$, $SF_6$, $NF_3$, $F_2$ and the like may be used, in addition to that. The etching agent may be arbitrarily selected by an operator.

The opening 213 can be formed by being irradiated with laser light. Alternatively, after forming the opening by being irradiated with laser light, the separation layer can be separated from the substrate without removing the separation layer by using an etching agent. This is because the separation layer is partly removed due to irradiation of laser light.

Next, the first sheet material 214 is adhered to the insulating film 212 where is an opposite side of the substrate 200, and the element formation portion 215, which is formed over the substrate 200 through the separation layer 201, is separated from the substrate 200 (FIG. 6D). The first sheet material 214 is made from a flexible film. At least one side of the first sheet material 214, which the element formation portion 215 is in contact with, is applied with an adhesive agent. For example, a film, in which an adhesive agent with a low adhering property that contains acrylic resin or the like is formed on a base film made from polyester or the like, can be used.

Figure 7A:
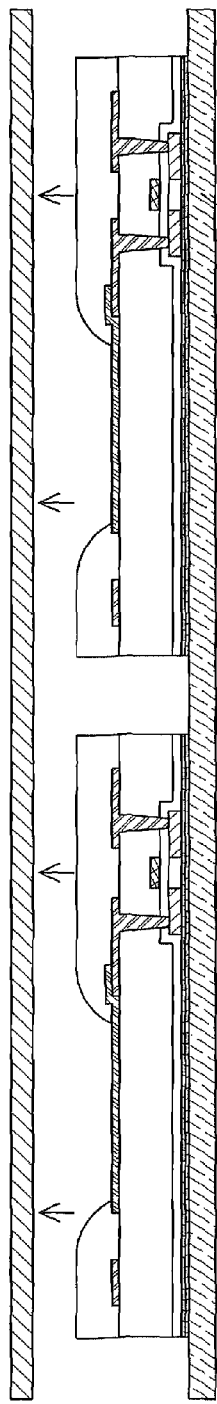
FIGS. 7A to 7C are cross sectional views showing a method for manufacturing a display device according to the invention.

An surface of the element formation portion 215, which is opposite to the surface of the element formation portion 215 adhered with the first sheet material 214, is adhered to a second sheet material 216, and the element formation portion 215 is separated from the first sheet material 214 (FIG. 7A).

Figure 7B:
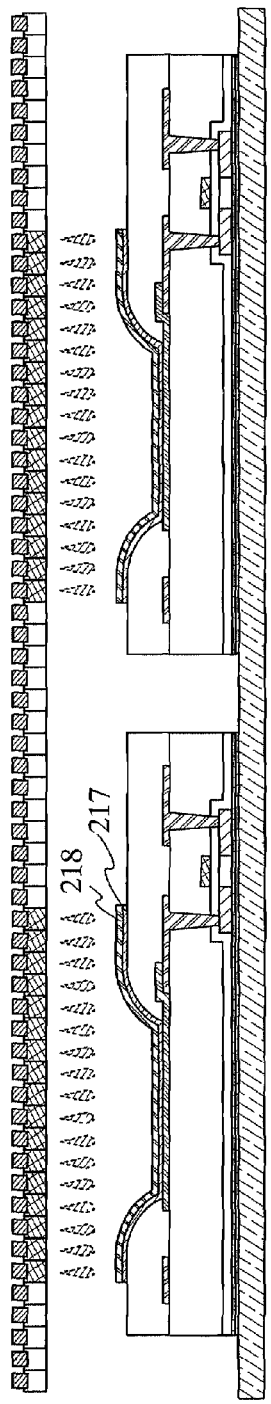

Subsequently, a light emitting layer 217 is selectively formed on the pixel electrode 210 (FIG. 7B). The light emitting layer 217 may be selectively formed by the droplet discharging method or by screen printing or gravure printing. In this embodiment mode, the light emitting layer 217 is selectively formed by the droplet discharging method. When forming a display device that can perform color display, light emitting layers emitting light of three colors of R, G and B are selectively formed, respectively. By forming the light emitting layer using the droplet discharging method or printing, wasted materials can be reduced, making it possible to reduce the cost.

When there is a problem of strength and the like, an insulating film or the like may be formed in the opening 213 prior to forming the light emitting layer 217. In this case, the insulating film can be selectively formed by the droplet discharging method.

With respect to light generated in a light emitting element, there are a case in which light generated in a light emitting element is emitted to a side of a substrate (top emission), a case in which the light is emitted to an opposite side of the substrate (bottom emission), and a case in which the light is emitted both sides (dual emission) by forming a pair of electrodes to be made of transparent materials or to have thickness to transmit a light. Any case can be employed in this embodiment mode. Further, the light emitting layer 217 may be a singe layer type, a lamination layer type, or a mixed type having no interfaces. In addition, a singlet material, a triplet material, or a combination thereof can be used as the light emitting layer 217. Additionally, an organic material including a low molecular weight material, a high molecular weight material and an intermediate molecular weight material, an inorganic material typified by molybdenum oxide having an excellent electron injecting property and the like, or a composite material including the organic material and the inorganic material may be used.

Thereafter, a counter electrode 218 is formed (FIG. 7B). The counter electrode 218 can be selectively formed by discharging a composition that contains a conductive material using the droplet discharging method. The above-mentioned materials for the pixel electrode 210 can be used as the counter electrode 218 depending on a case whether the counter electrode serves as anode or a cathode. Further, the counter electrode 218 may be formed over an entire surface. In this case, an insulating film is preferably filled in the opening 213 in advance so as not to generate a stepped cut and the like in the counter electrode due to the opening. As the insulting film, a resin material such as polyimide, polyamide, BCB (benzocyclobutene), acrylic and phenol can be used.

Figure 7C:
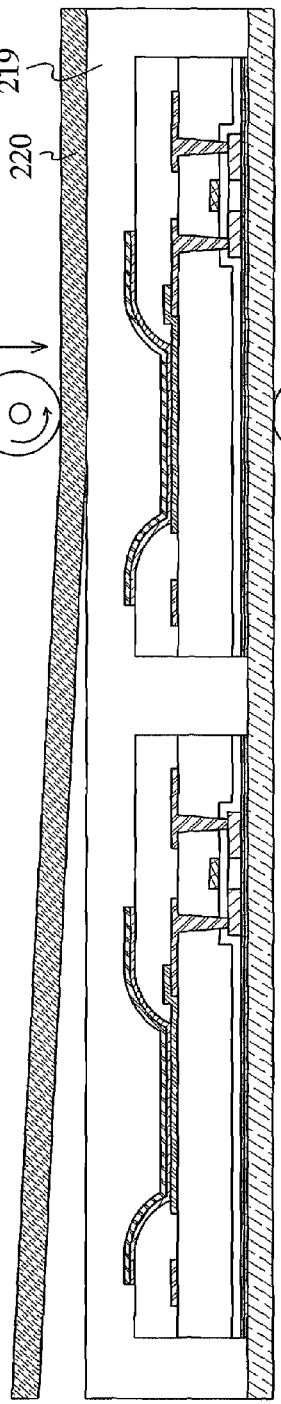

Subsequently, a third sheet material 220 is adhered to one surface of the element formation portion 215, which is an opposite from the surface of the element formation portion adhered with the second sheet material 216 to seal the element formation portion 215 with the second and third sheet materials 216 and 220 (FIG. 7C). Therefore, the element formation portion 215 is sealed with the second sheet material 216 and the third sheet material 220. When a water resisting property and the like of the light emitting layer is concerned, a protection film 219 may be formed prior to sealing the element formation portion. This protection film 219 is formed to prevent the light emitting layer from being in contact with atmospheric air or moisture of an outside portion. Therefore, the protection film 219 can be formed using a resin material such as epoxy resin, acrylic resin, phenol resin, novolac resin, melamine resin and urethane resin, resin containing a fluorine atom as a liquid-repellent material, resin only including hydrocarbon, or the like. Specifically, resin including a monomer that contains a fluorine atom within a molecule or resin containing a monomer that includes only carbon and a hydrogen atom can be given. In addition, an organic material such as acrylic, benzocyclobutene, parylene, flare, polyimide with a light transmitting property, a compound material formed by polymerization of siloxane resin or the like, a composition containing a water-soluble homopolymer and a water-soluble copolymer, and the like can be used. Additionally, the protection film can be formed using an inorganic material.

The second and third sheet materials 216 and 220 are formed using flexible films, and for example, they are formed using laminate films. Concretely, a base film such as polyester on which a hot-melt film is formed can be used here. When the second sheet material 216 and the third sheet material 220 are adhered to the element formation portion 215 while one or both of a pressure treatment and a heat treatment is/are carried out, they can be adhered thereto at short times. In addition, by providing the counter electrode on the surface of the third sheet material in advance, the counter electrode can be formed at the time of sealing the element formation portion 215 with the third sheet material.

Further, the separated substrate 200 can be reused in this embodiment mode. As a result, a same substrate can be reused in the process of manufacturing display devices with use of the substrate. When using a quartz substrate that is more expensive than a glass substrate, the cost can be reduced. Further, in the case of reusing the substrate, it is preferable to control the apparatus so as not to generate scratches on the surface of the substrate in a separation step. However, when some scratches are formed on the surface of the substrate, an organic resin film or an inorganic resin film may be formed thereon by the droplet discharging method, or the surface of the substrate may be subjected to a planarizing treatment by grinding or polishing.

According to the above process, a film-type display device is completed. Although this embodiment mode shows an example of an organic EL display device using an electroluminescent layer, the present invention is not limited thereto. Alternatively, the present invention can be applied to a liquid crystal display device or a display device using other light emitting element. A case where the above-described process is applied to a liquid crystal display device will be described with reference to FIGS. 22A to 22C. As described above, element formation portions 230 each constituting parts of a liquid crystal display device are formed over a substrate with rigidity. A first sheet material 214 is attached to one surface of each element formation portion 230, and then the element formation portions 230 are separated from the substrate. Further, orientation films 271 are herein formed to cover pixel electrodes in forming the element formation portions over the substrate. Subsequently, a second sheet material 216 is adhered to the other surface of each element formation portion, and then the element formation portions 230 are separated from the first sheet material 214 (FIG. 22A). Thereafter, liquid crystal layers and counter electrodes are formed over the element formation portions 230 by processing means (FIG. 22B). The liquid crystal layers may be formed using a known method. For example, the liquid crystal layers are formed by a dripping injection method or the like. A third sheet material 220 is adhered to the surfaces of a counter electrode 229 and over a liquid crystal layer 219 that is formed on the element formation portions 230 so that the element formation portions can be sealed with the second sheet material 216 and the third sheet material 220. Accordingly, the liquid crystal display device can be completed (FIG. 22C).

The liquid crystal display device is formed between the orientation films 271 and 272. By providing polarizing plates over and under the liquid crystal display device, an image can be displayed on the liquid crystal display device.

In the film-type display device manufactured according to the present embodiment mode, since the opening 213 is provided between pixels, the completed film-type display device can be easily folded. That is, providing the opening 213 makes it possible to reduce pressure that is applied to pixels in folding the film-type display device. Also, the same effect can be obtained by filling a flexible substance in the opening 213. As the flexible substance, organic materials such as polyethylene, vinyl acetate, ethylene vinyl acetate, polystyrene, polyurethane, polypropylene, polyvinyl fluoride, vinyl chloride, polyester, polyamide and polyimide can be used.

Although a top-gate thin film transistor is described in this embodiment mode with reference to the specific examples, a bottom-gate thin film transistor may also be used. Also, a passive matrix structure may be employed though an example of an active matrix structure is shown in this embodiment mode. The pixel region is described in the present embodiment mode. Meanwhile, after the pixel region and a driver circuit for driving the pixel portion are formed over a same substrate, the pixel portion and the driver circuit may be simultaneously separated from the substrate, and then be transferred to a flexible substrate. A wiring for connecting the pixel portion and the driver circuit may be formed prior to separating the pixel portion and the driver circuit from the substrate, or the wiring may be formed by using processing means after separating the pixel portion and the driver circuit from the substrate and transferring them to the flexible substrate. Alternatively, after the driver circuit, the circuit for controlling the pixel region, and the like are formed over different substrates, they may be separated from the respective substrates and provided over flexible substrates, respectively. Thereafter, a wiring for connecting the driver circuit and the pixel region may be formed. In this case, since specifications can be changed in each substrate, a display device can be formed efficiently.

The present embodiment mode can be implemented by being freely combined with Embodiment Mode 1.

Embodiment Mode 3

In this embodiment mode, a method for manufacturing a display device that is different from that of Embodiment Mode 2 will be described with reference to the drawings. Concretely, two kinds of methods for manufacturing display devices that are different from that of Embodiment Mode 2 will be described with reference to FIGS. 8A to 8D, FIGS. 9A to 9D, FIGS. 10A to 10D and FIGS. 11A to 11C. Further, same portions as those of Embodiment Mode 2 are denoted by same reference numerals.

In an example as shown in FIGS. 8A to 8D and FIGS. 9A to 9D, parts of a display device such as a separation layer 201, a first insulating film 202, a second insulating film 203, a semiconductor film 204 and a gate insulating film 205 are provided over a substrate 200. The parts of the display device are separated from the substrate. Thereafter, the parts of the display device separated from the substrate 200 are transferred to a flexible substrate. Remaining parts of the display device such as a gate electrode, an interlayer insulating film, source or drain electrodes, a wiring, a pixel electrode, a light emitting layer and a counter electrode are formed over the flexible substrate. A specific method for manufacturing the display device will be describe below. Further, materials used in this embodiment modes are same as those used in Embodiment Mode 2, other than materials that are particularly mentioned in this embodiment mode.

Figure 8A:
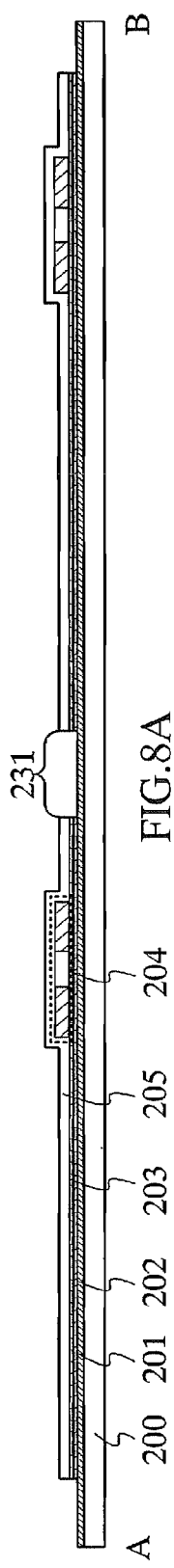
FIGS. 8A to 8D are cross sectional views showing a method for manufacturing a display device according to the invention.

At first, the separation layer 201, the first insulating film 202, the second insulating film 203, the semiconductor film 204 and the gate insulating film 205 are formed over the substrate 200. Thereafter, an opening 231 for introducing an etching agent is formed (FIG. 8A). This opening 231 is formed between pixel portions that will be formed later, except in a portion where the semiconductor film is formed and a portion where a wiring or an electrode will be formed later.

Figure 8B:

Subsequently, an etching agent is introduced in the opening to remove the separation layer 201. The separation layer 201 may be removed completely. However, the separation layer 201 is partly left so as not to separate an element formation portion 232 constituting parts of the display device (hereinafter, referred to as the element formation portion 232) from the substrate 200 completely (FIG. 8B).

Figure 8C:
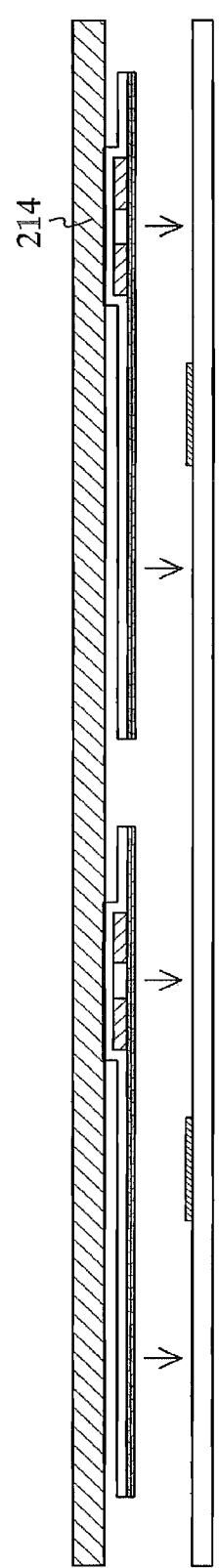

Next, a first sheet material 214 is adhered to the gate insulating film 205 which is a top surface of the element formation portion 232, and then the element formation portion 232 that is partly connected to the substrate 200 through the separation layer is separated from the substrate 200 (FIG. 8C).

Figure 8D:
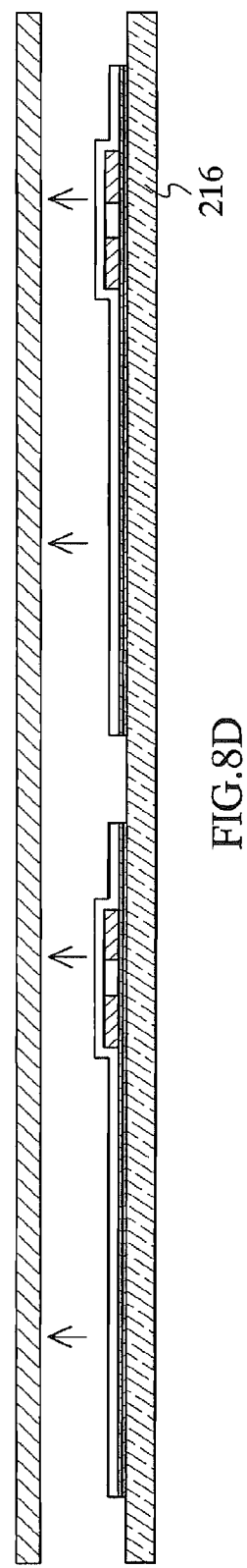

Subsequently, a second sheet material 216 is adhered to the surface of the element formation portion 232, where is opposite from the surface thereof adhered with the first sheet material 214, and then the element formation portion 232, which is a thin film, is separated from the first sheet material 214 (FIG. 8D). By carrying out the separation treatment twice, the substrate 200 can be substituted by a flexible substrate. Further, a sheet material with a low adherence property is preferably used as the first sheet material used in the first separation treatment since the first sheet material is separated from the element formation portion 232 after it is adhered to the element formation portion.

Thereafter, a gate electrode 233, an interlayer insulating film 234, source or drain electrodes 235 and 236, a wiring 237, a pixel electrode 238, a light emitting layer 217 and a counter electrode 218 are formed on the element formation portion 232, which is provided over the second sheet material 216 (FIGS. 9A to 9D).

Figure 9A:
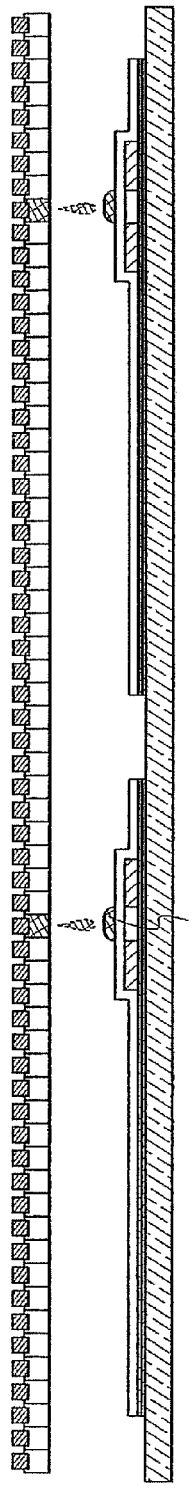
FIGS. 9A to 9D are cross sectional views showing a method for manufacturing a display device according to the invention.

In FIG. 9A, the gate electrode 233 is selectively formed by the droplet discharging method. The gate electrode is formed by using a conductive material that includes one or more metal of Ag, Au, Cu, Pd and the like or a metal compound thereof. Also, a conductive material including one or more metal of Cr, Mo, Ti, Ta, W, Al and the like or a metal compound thereof can also be used if they can be dispersed in a solution while preventing them from being agglutinated by using a dispersing agent. In addition, when plural conductive films are laminated by discharging a conductive material at several times using the droplet discharging method, a gate electrode including the plural conductive films can be formed. Furthermore, a conductive material in which any material selected from Au, Ag and Cu is dissolved or dispersed in a solvent in consideration of the specific resistance value, is preferably used as a composition discharged through a nozzle. More preferably, low-resistant Ag or Cu is used. In the case of using Ag or Cu, a barrier film is preferably provided in combination with the gate electrode so as to prevent impurities. As the barrier film, a silicon nitride film or nickel boron (NiB) can be used.

Figure 9B:
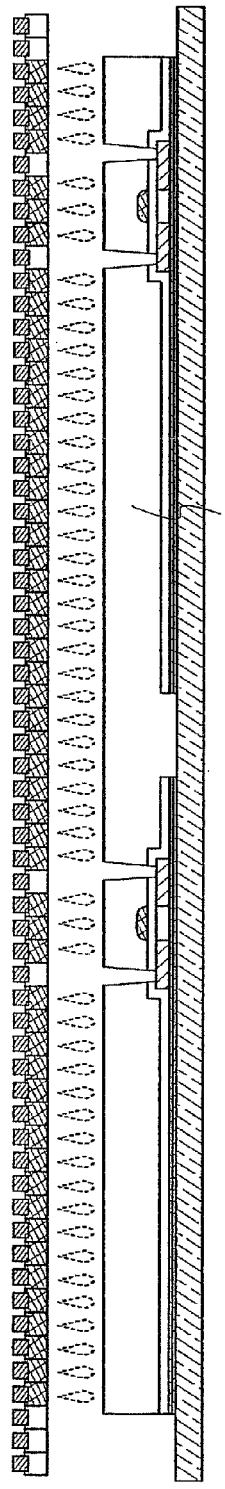

Next, the interlayer insulating film 234 is formed to cover the gate electrode 233 (FIG. 9B). Here, a solvent in which an insulating material is dissolved or dispersed is discharged by the droplet discharging method to selectively form the interlayer insulating film 234. While utilizing the interlayer insulating film 234, which is formed selectively, as a mask, the gate insulating film 205 is etched to form contact holes that reach the source or drain regions formed in the semiconductor film 204.

As the insulating material discharged to form the interlayer insulating film, resin materials such as epoxy resin, acrylic resin, phenol resin, novolac resin, melamine resin and urethane resin can be used. When using these resin materials, the viscosity thereof may be adjusted by dissolving or dispersing the materials in a solvent. As a liquid-repellent material, resin containing a fluorine atom, resin only including hydrocarbon, or the like can be used. Concretely, resin including a monomer that contains a fluorine atom within a molecule or resin containing a monomer that includes only carbon and a hydrogen atom can be given. In addition, an organic material such as acrylic, benzocyclobutene, parylene, flare, polyimide with a light transmitting property, a compound material formed by polymerization of siloxane resin or the like, a composition containing a water-soluble homopolymer and a water-soluble copolymer, and the like can be used. In the case of using an organic material, since the organic material has an excellent planarizing property, when a conductive material is formed later on the organic material, the thickness of the conductive material is not extremely thin in an uneven portion or the conductive material is not disconnected, and therefore, the organic material is preferably used. Further, to prevent the generation of degasification, the organic material is preferably sandwiched between thin films made from an inorganic material containing silicon.

Figure 9C:
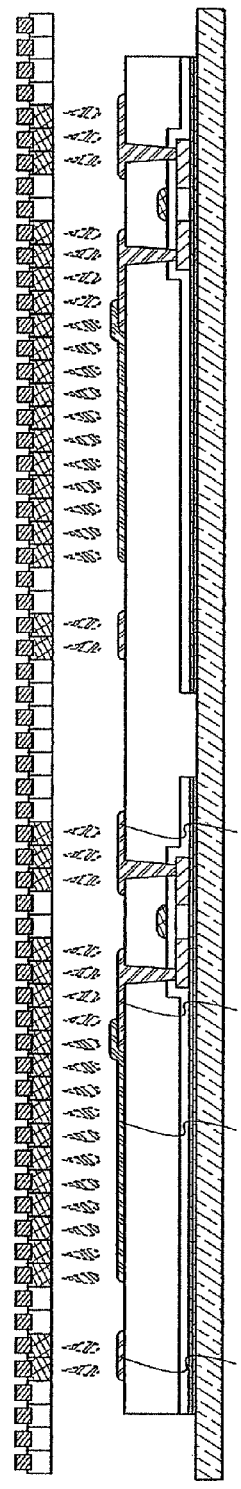

Next, the source or drain electrodes 235 and 236, which are electrically connected to the source or drain regions of the semiconductor film 204, the wiring 237 and the pixel electrode 238 are formed (FIG. 9C). These electrodes and wiring are selectively formed by the droplet discharging method here. The source or drain electrodes 235 and 236 and the wiring 237 can be formed using any of the above-mentioned materials for the gate electrode 233.

Figure 9D:
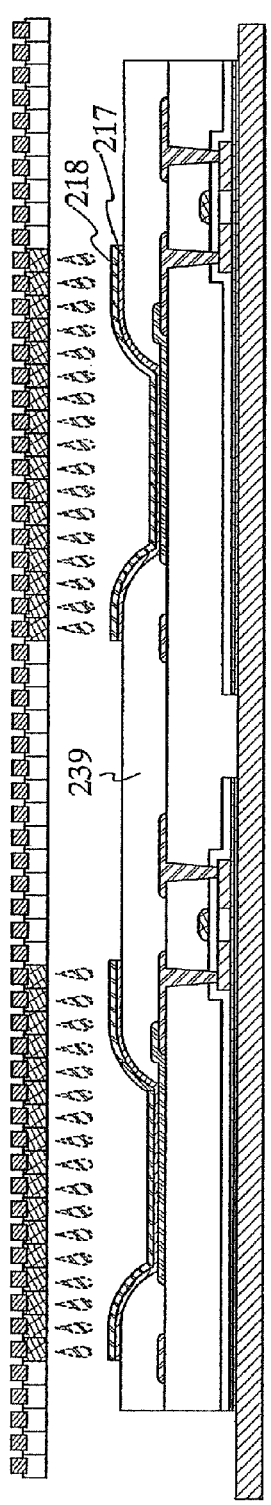

An insulating film 239 functioning as a partition wall (bank) is next formed. The light emitting layer 217 and the counter electrode 218 are formed (FIG. 9D). Afterwards, the element formation portion, the gate electrode, the interlayer insulating film, the source or drain electrodes, the wiring, the pixel electrode, the light emitting layer and the counter electrode are sealed with a second sheet material and a third sheet material as shown in FIG. 7C. The insulating film 239 can be selectively formed by the droplet discharging method. Any of materials for the insulating film 234 can be used to form the insulating film 239. The counter electrode 218 may be formed over an entire surface.

By forming the electrodes, the wiring and the insulating film using the droplet discharging method, the utilization efficiency of materials can be improved, making it possible to manufacture a display device at low cost. Although the gate electrode, the insulating film, the wiring, the pixel electrode and the like are formed by the droplet discharging method, they may be formed using various printing methods such as screen printing, gravure printing, or using a atmospheric pressure plasma device.

Next, another method for manufacturing a display device that is different from the specific example as shown in FIGS. 8A to 8D and FIGS. 9A to 9D will be described with reference to FIGS. 10A to 10D and FIGS. 11A to 11C.

In the example as shown in FIGS. 10A to 10D, a separation layer 201, a first insulating film 202, a second insulating film 203, a semiconductor film 204, a gate insulating film 205, a gate electrode 206, an interlayer insulating film 207 and the like are formed over a substrate 200. Thereafter, these elements are separated from the substrate 200. The elements separated from the substrate 200 are transferred to a flexible substrate, and then source or drain electrodes, a wiring, a pixel electrode, a light emitting layer, a counter electrode and the like are formed. A specific method for manufacturing a display device will be described below.

The separation layer 201, the first insulating film 202, the second insulating film 203, the semiconductor film 204, the gate insulating film 205, the gate electrode 206 and the interlayer insulating film 207 are formed over the substrate 200 (FIG. 10A).

Thereafter, an opening 241 for introducing an etching agent and contact holes 242 that reach source or drain regions of the semiconductor layer 204 are simultaneously formed. The opening 241 is preferably formed except in a portion where the semiconductor film is formed and a portion where the wiring or the electrodes will be formed later.

Subsequently, the etching agent is introduced in the opening 241 to remove the separation layer 201. The separation layer 201 may be completely removed. However, the separation layer 201 is partly left without removing it completely so as not to separate an element formation portion 243 constituting parts of the display device (hereinafter, referred to as the element formation portion 243) from the substrate 200 completely (FIG. 10B).

A first sheet material 214 is adhered to one surface of the element formation portion 243 (i.e., the surface of the interlayer insulating film 207), and then the element formation portion 243 is separated from the substrate 200 (FIG. 10C).

Subsequently, a second sheet material 216 is adhered to the other surface of the element formation portion 243 where is an opposite from the surface adhered with the first sheet material 214, and then the element formation portion 243 is separated from the first sheet material 214 (FIG. 10D). By carrying out the separation treatment twice, the substrate 200 can be substituted by a flexible substrate. Further, a sheet material with a low adherence property is preferably used as the first sheet material used in the first separation treatment since the first sheet material is eventually separated from the element formation portion 232 after it is adhered to the element formation portion.

Figure 11A:
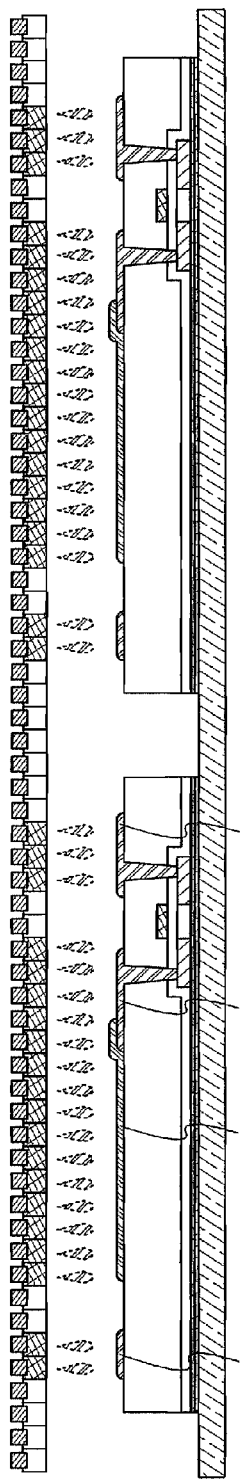
FIGS. 11A to 11C are cross sectional views showing a method for manufacturing a display device according to the invention.
Figure 11B:
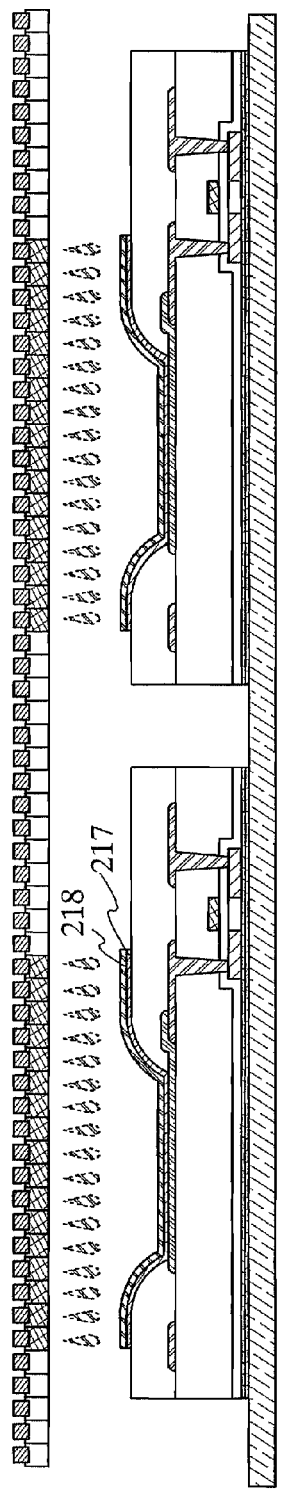
Figure 11C:
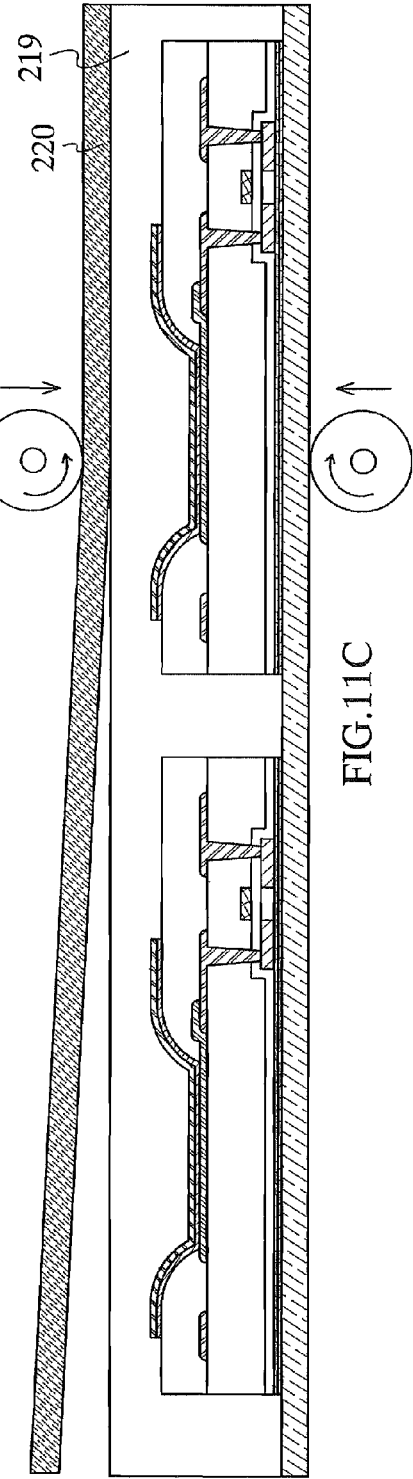

Afterwards, the source or drain electrodes 235 and 236, the wiring 237, the pixel electrode 238, the light emitting layer 217 and the counter electrode 218 are formed as shown in FIGS. 11A to 11C. The element formation portion 243, the source or drain electrodes, the wiring, the pixel electrode, the light emitting layer and the counter electrode are sealed with the second sheet material 216 and a third sheet material 220 so as to complete a film-type display device. Alternatively, prior to forming the light emitting layer 217, an insulating film or the like may be formed in the opening 241, and then the light emitting layer may be formed over an entire surface of a pixel region.

The different methods for forming the parts of the display device prior to performing the separation treatment are described above with two specific examples. However, the present invention is not limited thereto, and any element may be formed prior to carrying out the separation treatment.

The present embodiment mode can be implemented by being freely combined with the above described embodiment modes.

Embodiment Mode 4

In this embodiment mode, a case of forming one display device by connecting display devices provided over different substrates will be described. Concretely, after parts constituting respective display devices are provided over a plurality of substrates, the substrates are aligned and the parts constituting the display devices are separated from the substrates. Then remaining parts of the display devices are formed over the flexible substrate to complete one display device. The present embodiment mode will be described with reference to the drawings. Further, portions indicating the same portions as shown in the above embodiment modes are denoted by same reference numerals.

Figure 12A:
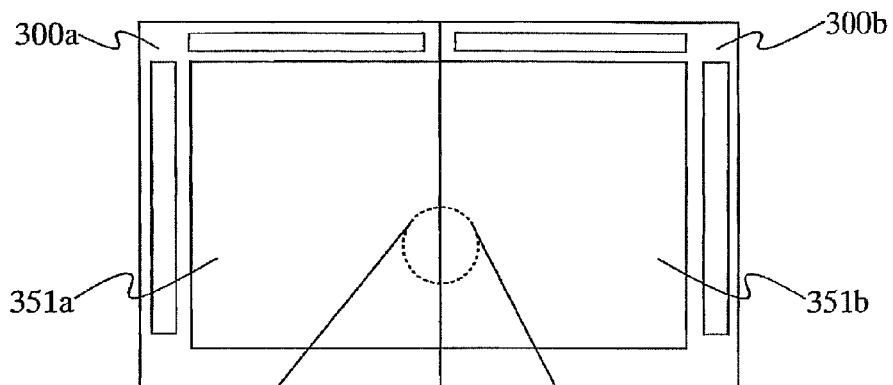
FIGS. 12A and 12B are diagrams showing structure of a pixel region of a display device according to the invention.

Structures of pixel regions in the case where pixel regions 351a and 351b that are provided over two different substrates 300a and 300b are connected to each other as shown in FIG. 12A is illustrated in FIGS. 13A to 13D and FIGS. 14A and 14B.

Figure 12B:
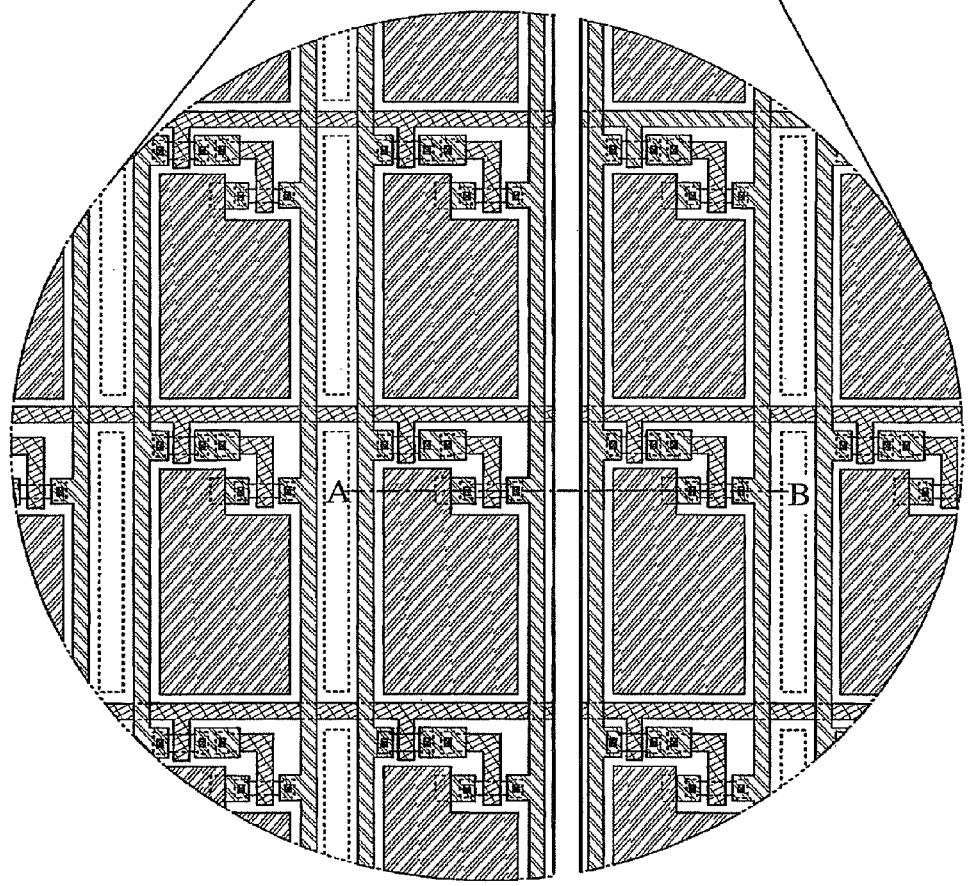

As described in the above embodiment modes, the same structure as that of FIG. 6C is provided over the substrates 300a and 300b, respectively (FIG. 13A). Further, a cross section taken along a line A-B of FIG. 12B corresponds to a cross sectional view taken along a line A-B of FIG. 13A.

Subsequently, the substrates 300a and 300b are aligned using controlling means such as a CCD camera to connect the substrates 300a and 300b together with an adhesive agent 356 (FIG. 13B). Here, the adhesive agent 356 is only adhered to the substrates 300a and 300b and is not adhered to element formation portions 215a and 215b constituting parts of the display devices (hereinafter, referred to as the element formation portions 215a and 215b), which are provided over the substrates 300a and 300b. At this time, a gap (hereinafter, referred to as a connection gap 355) is generated between the substrates 300a and 300b. The positions of the element formation portions formed over the substrates 300a and 300b are adjusted such that the connection gap 355 is positioned between pixels of the display devices that will be formed later. When there is no possibility of misalignment of the substrates 300a and 300b since they are fixed, the substrates may be aligned without using the adhesive agent. Alternatively, the edges of the substrates may be trimmed to connect the substrates together. From the viewpoint of the connection of the substrates 300a and 300b, the connection gap 355 is preferably provided to have a width that equal to a distance between pixel electrodes in the substrate 300a or a distance between pixel electrodes in the substrate 300b, though the width of the connection gap 355 may be set to be larger than the distance between the pixel electrodes in the substrate 300a or the distance between the pixel electrodes in the substrate 300b.

Thereafter, a first sheet material 214 is adhered to the surfaces of the element formation portions 215a and 215b provided over the substrate 300a and 300b, and then the element formation portions 215a and 215b are separated from the substrates 300a and 300b (FIG. 13C).

Subsequently, a second sheet material 216 is adhered to the other surfaces of the element formation portions 215a and 215b where are opposite from the surfaces thereof adhered with the first sheet material 214, and then the element formation portions 215a and 215b are separated from the first sheet material 214 (FIG. 13D).

Afterwards, light emitting layers 217 and counter electrodes 218 are formed over the element formation portion 215a and 215b in the same manner as the above embodiment modes (FIG. 14A). Also, at this moment, an insulating film and the like may be selectively formed in the openings 213 and the connection gap 355. By filling a same substance in the openings 213 and the connection gap 355, a boundary line caused between the different substrates that are connected to each other can be made unnoticeable.

Next, the element formation portions over which the light emitting layers 217 and the counter electrodes 218 are formed are sealed using the second and third sheet materials 216 and 220 to complete a film-type display device (FIG. 14B). As set forth above, a protection film 219 is preferably formed on the counter electrodes 218 prior to adhering the third sheet material 220. At this time, when no material is provided within the openings 213 and the connection gap 355, the protection film is formed to be filled in the openings and the connection gap.

Generally, when one display device is formed by connecting a plurality of display devices together, since a gap (or a boundary line) is generated between the connected substrates, there is a problem in which the boundary line is recognized as a defect when displaying an image on the display device. In this embodiment mode, however, the boundary line can be made unnoticeable by connecting the display devices together while controlling the width of the connection gap 355 to be equal to the distance between the pixels (which is the width of the openings 213 here). Furthermore, after attaching the two different substrates 300a and 300b to each other, the parts of the display devices provided over the substrates are separated from the substrates and then are transferred to a flexible substrate as a common substrate. Accordingly, the boundary line can be made more unnoticeable.

Consequently, a large-size film-type display device can be manufactured by connecting the display devices, which are provided over the two substrate independently, to each other.

Although the example where the partition walls are provided over the substrates prior to performing the separation treatment (corresponding to FIGS. 6A to 6D and FIGS. 7A to 7C) is shown in this embodiment mode, this embodiment mode can be applied to the structures as shown in FIGS. 8A to 8D, FIGS. 9A to 9D, FIGS. 10A to 10D and FIGS. 11A to 11C in the same manner.

Figure 15A:
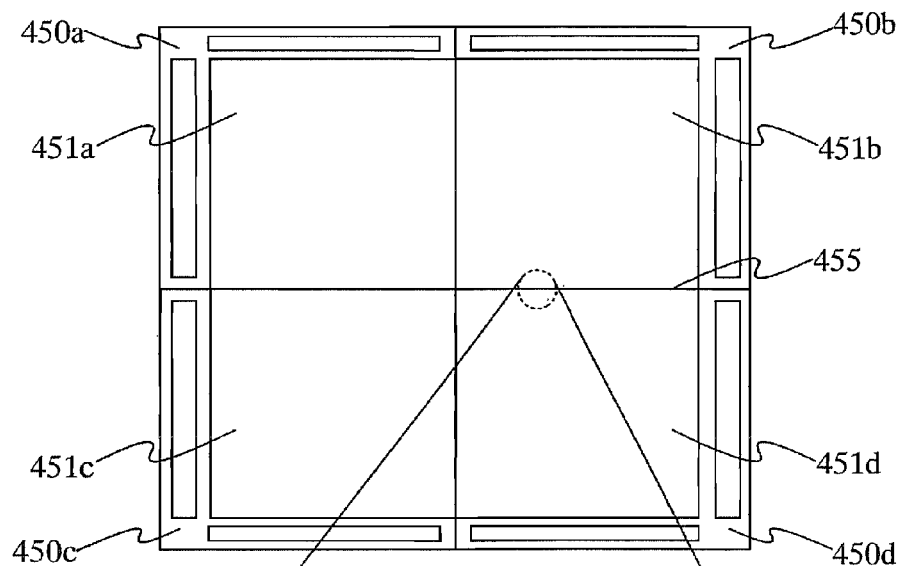
FIGS. 15A and 15B are diagrams showing a structure of a pixel region of a display device according to the invention.
Figure 15B:
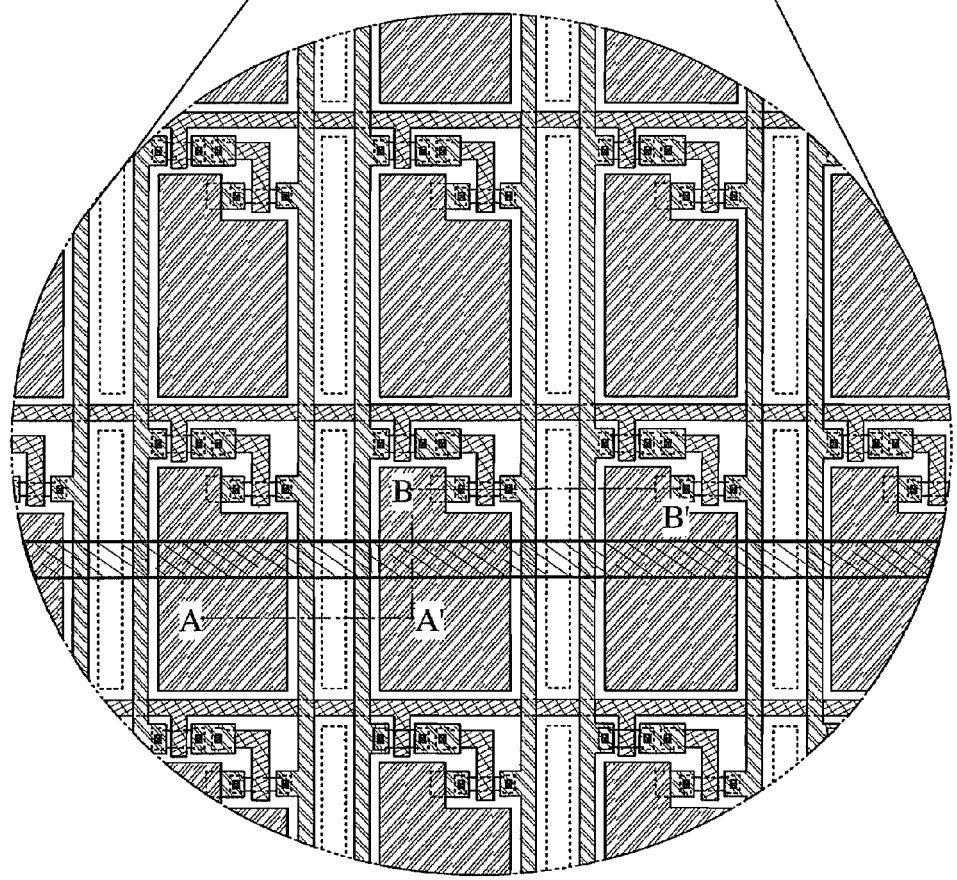

Next, structures of pixel regions in the case where pixel regions 451a to 451d that are provided over different substrates 450a to 450d as shown in the FIGS. 15A and 15B are connected to one another are shown in FIGS. 16A to 16D and FIGS. 17A to 17D. Further, a connection portion between the pixel regions 451b and 451d are specifically described here.

As described in the above embodiment modes, the same structures as shown in FIG. 10B are provided over the substrates 450a to 450d (FIG. 16A). Thereafter, the substrates 450a to 450d are aligned accurately using controlling means such as a CCD camera, and the adjacent substrates are attached to each other with an adhesive agent 456 (FIG. 16B). Here, the adhesive agent 456 is only pasted to the substrates 450a to 450d and is not pasted to element formation portions 243a to 243d that constituting parts of the display devices.

Next, a first sheet material 214 is adhered to the surfaces of the element formation portions 243a to 243d provided over the substrates 450a to 450d, and then the element formation portions 243a to 243d are separated from the substrates 450a to 450d (FIG. 16C).

Subsequently, a second sheet material 216 is adhered to the other surfaces of the element formation portions 243a to 243d where are opposite from the surfaces thereof attached with the first sheet material 214, and then the element formation portions 243a to 243d adhered with the first sheet material 214 are separated from the first sheet material (FIG. 16D).

Next, source or drain electrodes, wirings, pixel electrodes, light emitting layers, counter electrodes and the like are formed on the element formation portions 243a to 243d, which are provided on the second sheet material 216 by using processing means.

An insulating material is filled in connection gaps 455 between the adjacent element formation portions 243a to 243d, which are formed in connecting the substrates to one another (FIG. 17A). In this embodiment mode, a composition containing an insulating material is selectively discharged in each connection gap 455 by the droplet discharging method to form an insulating film 457. As the insulating material, resin materials such as epoxy resin, acrylic resin, phenol resin, novolac resin, melamine resin and urethane resin can be used. When using these resin materials, the viscosity thereof may be adjusted by dissolving or dispersing the materials in a solvent. As a liquid-repellent material, resin containing a fluorine atom, resin only including hydrocarbon, or the like can be used. Concretely, resin including a monomer that contains a fluorine atom within a molecule or resin containing a monomer that includes only carbon and a hydrogen atom can be given. In addition, an organic material such as acrylic, benzocyclobutene, parylene, flare, polyimide with a light transmitting property, a compound material formed by polymerization of siloxane resin or the like, a composition containing a water-soluble homopolymer and a water-soluble copolymer, and the like can be used. In the case of using an organic material, since the organic material has an excellent planarizing property, when a conductive material is formed later on the organic material, the thickness of the conductive material is not extremely thin in an uneven portion or the conductive material is not disconnected. Therefore, the organic material is preferably used.

Next, source or drain electrodes 235 and 236, a wiring 237 and a pixel electrode 238 are formed (FIG. 17B). In this case, the source or drain electrodes 235 and 236, the wiring 237 and the pixel electrode 238 are formed on the insulating film 457. Therefore, when slight uneven portions are caused on the surfaces of the interlayer insulating film 207 and the insulating film 457, uneven portions are also caused on the surfaces of the source or drain electrodes 235 and 236, the wiring 237 and the pixel portion 238, which are formed over the interlayer insulating film and the insulating film.

In FIGS. 16A to 16D and FIGS. 17A to 17D, a pixel electrode is commonly formed on the element formation portions that are formed in the edges of the different substrates. Therefore, when the plurality of display devices are connected to one another, boundary lines caused between the connected display devices can be made unnoticeable.

Afterwards, as described in the above embodiment modes, partition walls (banks) 239, a light emitting layer 217 and a counter electrode 218 are formed (FIG. 17C). The thus-formed element formation portions are sealed with a third sheet material 220 along with the second sheet material 216 so as to complete a film-type display device (FIG. 17D).

The connection portion between the pixel portions 451a and 451b or the connection portion between the pixel portion 451c and the pixel portion 451d can be connected to each other using the above described method.

Although a method for manufacturing a display device by adhering pixel regions is described in this embodiment mode, the present invention is not limited thereto. The present invention can be applied to a case where a pixel region and a driver circuit or a circuit for controlling the pixel region (a control circuit) are formed. That is, the pixel region and the driver circuit or the control circuit are formed over different substrates in advance, and the pixel region and the driver circuit or the control circuit can be separated from the respective substrates and then be transferred to a common flexible substrate. In this case, a wiring for connecting the pixel region and the driver circuit or the control circuit can also be formed over the flexible substrate.

As set forth above, a plurality of substrates can be connected to one another according to the present embodiment mode, and hence, a large size film-type display device can be manufactured.

Moreover, the present embodiment mode can be implemented by being freely combined with the above embodiment modes.

Embodiment Mode 5

A structure of a light emitting element will be described with reference to FIG. 18 in this embodiment mode.

Figure 18:
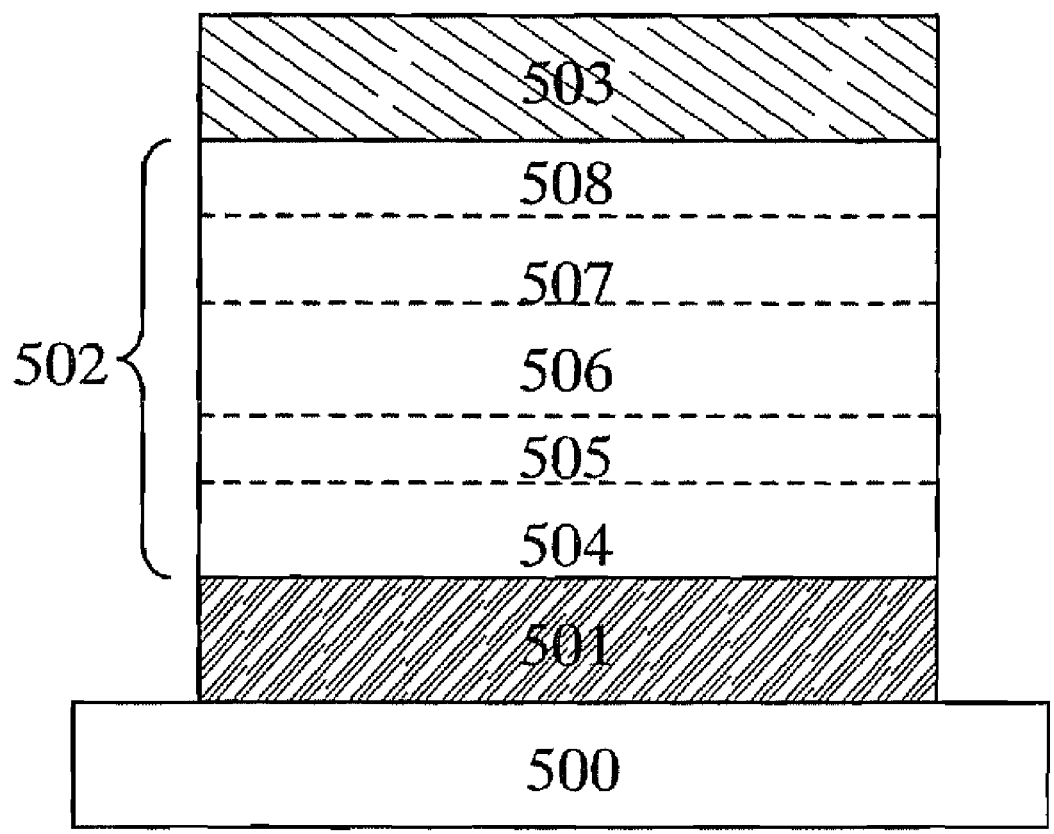
FIG. 18 is a diagram showing a structure of a light emitting layer according to the invention.

A light emitting element as shown in FIG. 18 comprises a first electrode 501 formed over a substrate 500, an electroluminescent layer 502 formed on the first electrode 501, and a second electrode 503 formed on the electroluminescent layer 502. In fact, various kinds of layers, a semiconductor element and the like are provided between the substrate 500 and the first electrode 501.

A case where the first electrode 501 serves as an anode and the second electrode serves as a cathode is described in this embodiment mode. Alternatively, the first electrode 501 may serve as the cathode and the second electrode may serve as the anode.

The electroluminescent layer 502 includes a single layer or a plurality of layers. When the electroluminescent layer 502 includes a plurality of layers, these layers can be classified into a hole injecting layer, a hole transporting layer, a light emitting layer, an electron transporting layer, an electron injecting layer and the like from the viewpoint of carrier transporting properties. Further, the respective layers are not necessary to have distinct boundary lines therebetween, and materials of respective layers are sometimes mixed partly so that an interface between the layers becomes indistinct. Organic materials and inorganic materials may be used for the respective layers. As the organic materials, any of a high molecular weight organic material, an intermediate molecular weight organic material and a low molecular weight organic material can be used. Further, the intermediate molecular weight organic material corresponds to an oligomer that comprises about 2 to 20 repetitive numbers of structural units (the degree of polymerization).

A hole injecting layer and a hole transporting layer are not always differentiated from each other exactly, and they are similar to each other in terms of their hole transporting properties (hole mobility) that are especially important characteristics. For the sake of convenience, a layer being in contact with an anode is referred to as the hole injecting layer, and a layer being in contact with this hole injecting layer is referred to as the hole transporting layer so as to differentiate therebetween. The same can be said for an electron transporting layer and an electron injecting layer. A layer being in contact with a cathode is referred to as the electron injecting layer while a layer being in contact with this electron injecting layer is referred to as the electron transporting layer. A light emitting layer sometimes also serves as the electron transporting layer, and this layer is also referred to as an electron transporting layer having a light emitting property. FIG. 18 shows an example where the electroluminescent layer 502 includes a first layer 504, a second layer 505, a third layer 506, a fourth layer 507 and a fifth layer 508. The first to fifth layers 502 to 508 are sequentially laminated to one another over the first electrode 501.

The first layer 504 is preferably formed using a material having a hole transporting property and a relatively low ionization potential along with an excellent hole injecting property so as to serve as a hole injecting layer. Such materials are largely classified into metal oxide, a low molecular weight organic compound and a high molecular weight organic compound. As the metal oxide, for example, vanadium oxide, molybdenum oxide, ruthenium oxide, aluminum oxide and the like can be used. As the low molecular weight organic compound, for example, starburst amine typified by m-MTDATA, metal phthalocyanine typified by copper phthalocyanine (abbreviation: Cu—Pc), phthalocyanine (abbreviation: $H_2$—Pc), a 2,3-dioxyethylene thiophene derivative and the like can be used. A film formed by co-evaporation of a low molecular weight organic compound and the above metal oxide may also be used. As the high molecular weight organic compound, for example, polyaniline (abbreviation: PAni), polyvinyl carbazole (abbreviation: PVK), a polythiophene derivative and the like can be used. Also, poly(ethylene dioxythiophene) (abbreviation: PEDOT) doped with poly(styrenesulfonic acid) (abbreviation: PSS) may be used. In addition, a mixture of a benzoxazole derivative and any one or more of TCQn, $FeCl_3$, $C_{60}$ and $F_4TCNQ$ may be used.

The second layer 505 is preferably formed using a known material having an excellent hole transporting property and low crystallinity so as to serve as a hole transporting layer. Concretely, a compound of aromatic amine (i.e., a compound having benzene ring-nitrogen bonds) is preferably used. For example, 4,4'-bis[N-(3-methylphenyl)-N-phenyl-amino]biphenyl (abbreviation: TPD), 4,4'-bis[N-(1-naphthyl)-N-phenyl-amino]biphenyl (abbreviation: α-NPD) that is a derivative of TPD, and the like can be given. Also, a starburst aromatic amine compound such as 4,4',4"-tris(N,N-diphenylamino)triphenylamine (abbreviation: TDATA) and MTDATA can be used as the second layer. In addition, 4,4',4"-tris (N-carbazolyl)triphenylamine (abbreviation: TCTA) may be used. Further, as a high molecular weight material, poly(vinyl carbazole) (abbreviation: PVK) and the like can be used.

The third layer 506 is preferably formed using a material having a high ionization potential along with a large bandgap so as to serve as a light emitting layer. Concretely, for example, metal complexes such as tris(8-quinolinolate)aluminum (abbreviation: $Alq_3$), tris(4-methyl-8-quinolinolate) aluminum (abbreviation: $Almq_3$), bis(10-hydroxybenzo[η] quinolinato)beryllium (abbreviation: $BeBq_2$), bis(2-methyl-8-quinolinolate)-(4-hydroxy-biphenyl)-aluminum (abbreviation: BAlq), bis(2-[2-hydroxyphenyl]-benzoxazolate)zinc (abbreviation: $Zn(BOX)_2$), and bis(2-[2-hydroxyphenyl]-benzothiazolate)zinc (abbreviation: $Zn(BTZ)_2$) can be used. In addition, various kinds of fluorescent dyes (a coumarin derivative, a quinacridone derivative, rubrene, a dicyanomethylene derivative, a 1-pyrone derivative, a stilbene derivative, various kinds of condensation aromatic compounds and the like) can be used as the third layer. Further, a phosphorescent material such as a platinum octaethylporphyrin derivative, a tris(phenylpyridine)iridium derivative, and a tris(benzylidene acetonate)phenanthrene europium derivative can be used.

As a host material used for the third layer 506, the above-mentioned hole transporting material or electron transporting materials can be employed. In addition, a bipolar material such as 4,4'-N,N'-dicarbazolyl biphenyl (abbreviation: CBP) can be used.

The fourth layer 507 is preferably formed using a material having an excellent electron transporting property so as to serve as an electron transporting layer. Concretely, a metal complex having quinoline skeleton or benzoquinoline skeleton typified by $Alq_3$ or a mixed ligand complex of the metal complex and the like can be used. For example, metal complexes such as $Alg_3$, $Almq_3$, $BeBq_2$, BAlq, $Zn(BOX)_2$, and $Zn(BTZ)_2$ can be given. In addition to the metal complexes, oxadiazole derivatives such as 2-(4-biphenylyl)-5-(4-tert-butylphenyl)-1,3,4-oxadiazole (abbreviation: PBD), and 1,3-bis (5-[p-tert-butylphenyl]-1,3,4-oxadiazole-2-yl)benzene (abbreviation: OXD-7); triazole derivatives such as 3-(4-tert-butylphenyl)-4-phenyl-5-(4-biphenylyl)-1,2,4-triazole (abbreviation: TAZ), and 3-(4-tert-butylphenyl)-4-(4-ethylphenyl)-5-(4-biphenylyl)-1,2,4-triazole (abbreviation: p-EtTAZ); imidazole derivatives such as TPBI; phenanthroline derivatives such as bathophenanthroline (abbreviation: BPhen) and bathocuproin (abbreviation: BCP) can be used.

The fifth layer 508 is preferably formed using a material having an excellent electron injecting property so as to serve as an electron injecting layer. Concretely, an ultra thin film of an insulating material such as alkali metal halide (e.g., LiF and CsF), alkali earth halide (e.g., $CaF_2$), and alkali metal oxide (e.g., $Li_2O$) is commonly used. Also, alkali metal complexes such as lithium acetylacetonate (abbreviation: Li(acac)) and 8-quinolinolato-lithium (abbreviation: Liq) can be effectively used. Furthermore, the fifth layer may includes a metal complex such as molybdenum oxide (MoOx), vanadium oxide (VOx), ruthenium oxide (RuOx) and tungsten oxide (WOx) or a benzoxazole derivative and one or more materials of alkali metal, alkali earth metal and transition metal. Additionally, titanium oxide may be used.

In a light emitting element having the above described structure, when voltage is applied between the first electrode 501 and the second electrode 503 and forward bias current flows through the electroluminescent layer 502, light can be generated in the third layer 506 and emitted through the first electrode 501 or the second electrode 503. Further, the electroluminescent layer 502 is not necessary to comprise the all first to fifth layers. In the present invention, the electroluminescent layer may comprises at least the third layer 560 serving as the light emitting layer. Furthermore, light emission is not obtained from only the third layer 506. Alternatively, light emission is sometimes obtained from a layer other than the third layer 506 depending on a combination of materials used in the first to fifth layers. In addition, a hole blocking layer may be provided between the third layer 506 and the fourth layer 507.

Further, depending on a color of light, a phosphorescent material sometimes can reduce the driving voltage and has higher reliability as compared with a fluorescent material. Therefore, when a full color display is performed using light emitting elements corresponding to three colors (Red, Green, and Blue) respectively, light emitting elements using a fluorescent material and light emitting elements using a phosphorescent material may be combined to equalize the levels of deterioration in the light emitting elements of the respective three colors.

FIG. 18 shows the case where the first electrode 501 is a anode and the second electrode 503 is a cathode. However, when the first electrode 501 serves as the cathode and the second electrode 503 serves as the anode, the first layer 504, the second layer 505, the third layer 506, the fourth layer 507 and the fifth layer 508 are laminated inversely. Specifically, the fifth layer 508, the fourth layer 507, the third layer 506, the second layer 505 and the first layer 504 are sequentially laminated over the first electrode 501.

By using a material that is resistant to etching as a layer that is nearest to the second electrode 503 (i.e., the fifth layer 508 in this embodiment mode) among the electroluminescent layer 502, when the second electrode 503 is formed on the electroluminescent layer 502 by sputtering, the sputtering damage with respect to the layer, which is nearest to the second electrode 503, can be reduced. As the material, which is resistant to etching, for example, metal oxide such as molybdenum oxide (MoOx), vanadium oxide (VOx), ruthenium oxide (RuOx) and tungsten oxide (WOx), a benzoxazole derivative, or thin metal films can be used. These materials are preferably formed by evaporation.

For example, when the first electrode is the cathode and the second electrode is the anode, the above mentioned material, which is resistant to etching, is used as a layer having a hole injecting property or a hole transporting property, which is nearest to the anode among the above electroluminescent layer. Concretely, in the case of using a benzoxazole derivative, a layer containing the benzoxazole derivative and one or more of TCQn, $FeCl_3$, $C_{60}$ and $F_4TCNQ$ is formed to be nearest to the anode.

For instance, when the first electrode is the anode and the second electrode is the cathode, the above mentioned material, which is resistant to etching, is used as a layer having an electron injecting property or an electron transporting property that is nearest to the cathode among the electroluminescent layer. Concretely, in the case of using molybdenum oxide, a layer containing the molybdenum oxide and one or more of alkali metal, alkali earth metal and transition metal is formed to be nearest to the cathode. Also, in the case of using a benzoxazole derivative, a layer containing the benzoxazole derivative and one or more of alkali metal, alkali earth metal and transition metal is formed to be nearest to the cathode. Further, a combination of metal oxide and a benzoxazole derivative may be used.

According to the above structure, even when the second electrode is formed using a transparent conductive film formed by sputtering, e.g., indium tin oxide (ITO), indium tin oxide containing silicon (ITSO), IZO (indium zinc oxide) in which 2 to 20% zinc oxide (ZnO) is mixed in indium oxide or the like, the sputtering damage with respect to a layer including an organic material of the electroluminescent layer can be reduced, thereby widening choices on materials for the second electrode.

The present embodiment mode can be freely combined with the above embodiment modes.

Embodiment Mode 6

Figure 19A:
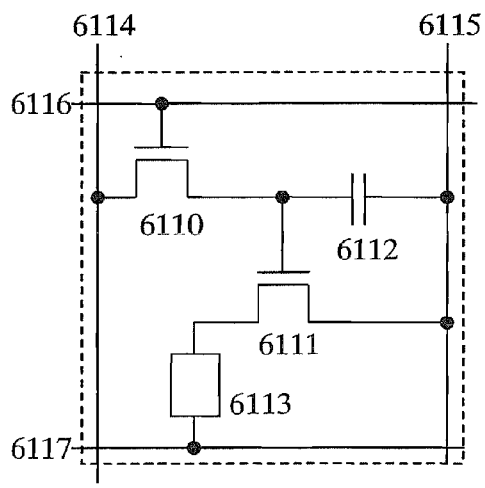
FIGS. 19A to 19C shows examples of circuit diagrams of a display device according to the invention.
Figure 19B:
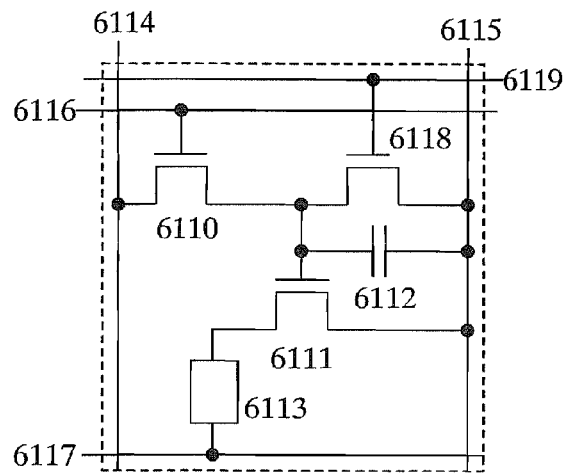

A circuit of a pixel portion of a display device having a display function according to the present invention will be described with reference to FIGS. 19A to 19C. FIG. 19A is an equivalent circuit diagram of a pixel. The pixel comprises a TFT 6110 for controlling input of a video signal with respect to a pixel 6101, a TFT 6111 for controlling the amount of current flowing between both electrodes of a light emitting element 6113 and a capacitor element 6112 for holding the voltage between a gate and a source of the TFT 6111 in a region surrounded by respective wirings of a signal line 6114, power supply lines 6115 and 6117 and a scanning line 6116. The capacitor element 6112 is illustrated in FIG. 19B. However, when the voltage between the gate and the source of the TFT 6111 can be held in a gate capacitor or another parasitic capacitor of the TFT 6111, the capacitor element 6112 may not be provided.

FIG. 19B is an equivalent circuit diagram showing a pixel circuit having a configuration in which a TFT 6118 and a scanning line 6119 are newly added to the pixel as shown in FIG. 19A. The arrangement of the TFT 6118 allows to stop the current from flowing through the light emitting element 6113 forcibly. Therefore, a lighting period can start simultaneously with or immediately after a writing period starts before signals are written into all the pixels. Consequently, the duty ratio can be improved, and in particular, moving images can be displayed favorably.

Figure 19C:
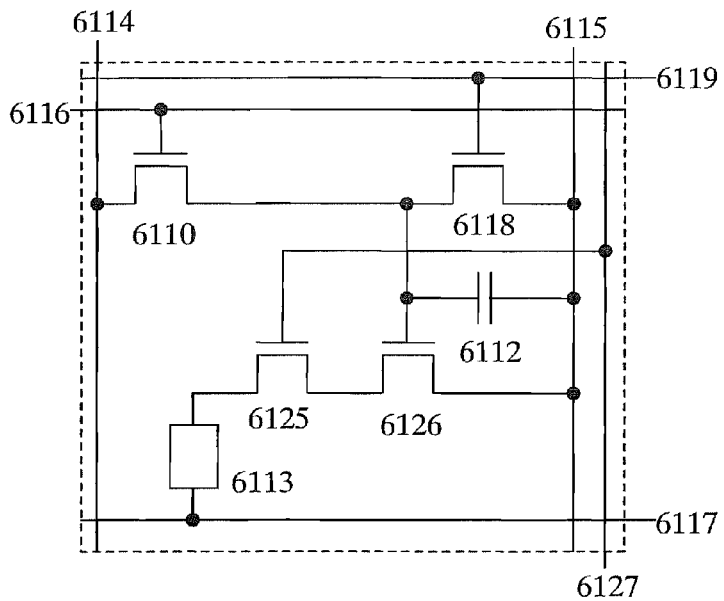

FIG. 19C is an equivalent circuit diagram of a pixel circuit in which TFTs 6125 and 6126 and a wiring 6127 are newly added to the pixel 6101 of FIG. 19B, though the TFT 6111 of the pixel 6101 is removed. In this configuration, by connecting a gate electrode of the TFT 6125 to the wiring 6127 in which the potential is maintained at a constant level, the potential of the gate electrode is fixed and the TFT 6125 is operated in a saturation region. The TFT 6126 is connected to the TFT 6125 in series and is operated in a linear region. Also, a video signal transmitting information about lighting or non lighting of the pixel is input in a gate electrode of the TFT 6126 through the TFT 6110. Since the amount of voltage between a source and a drain of the TFT 6126, which is operated in the linear region, is small, slight fluctuations in voltage between the gate and source of the TFT 6126 do not adversely affect the amount of current flowing through the light emitting element 6113. Accordingly, the amount of current flowing through the light emitting element 6113 is determined by the TFT 6125, which is operated in the saturation region. A channel length $L_1$ and a channel width $W_1$ of the TFT 6125 and a channel length $L_2$ and a channel width $W_2$ of the TFT 6126 are preferably set to satisfy the relation of $L_1/W_1 : L_2/W_2 = 5$ to $6,000:1$. Also, the both TFTs preferably have a same conductivity type from the viewpoint of the manufacturing process. Further, a depletion type TFT may be used as the TFT 6125, in addition to an enhancement type TFT.

When a multi-gray scale image is displayed in a display device, either an analog driving method using an analog video signal or a digital driving method using a digital video signal is used. The difference between the two methods is a controlling method of a light emitting element in a light emitting state and a non-light emitting state. In the analog driving method, gray scale level is adjusted by controlling current flowing through a light emitting element. Meanwhile, in the digital driving method, gray scale level is adjusted by using only two states of a light emitting element: on-state (where the luminance is approximately 100%) and off-state (where the luminance is approximately 0%). If only the on-state and the off-state are used in the digital driving method, an image can be displayed with no more than two gray scale levels. Therefore, in order to display a multi-gray scale image, the digital driving method is performed in combination with another method such as an area gray scale method and a time gray scale method.

If a digital video signal is used, the video signal may use either a voltage or a current. That is, a video signal input to a pixel in light emission of a light emitting element may have either a constant voltage or a constant current. When a video signal has a constant voltage, a constant voltage is applied to a light emitting element or a constant current flows through the light emitting element. Also, when a video signal has a constant current, a constant voltage is applied to a light emitting element or a constant current flows through the light emitting element. A driving method where a constant voltage is applied to a light emitting element is called a constant voltage drive. Meanwhile, a driving method where a constant current flows through a light emitting element is called a constant current drive. According to the constant current drive, constant current flows regardless of changes in resistance of a light emitting element.

In the display device of the present invention, either the analog driving method or the digital driving method can be used for a liquid crystal panel or a panel using a light emitting element. Also, the digital driving method may be combined with either the area gray scale method or the time gray scale system. In addition, other driving methods not given in this embodiment mode can be applied. Also, either the constant voltage drive or the constant current drive may be used.

Moreover, either an active matrix display device or a passive matrix display device may be used. When using the active matrix display device, since a light emitting element is driven with current, the analog driving method is preferably employed in the case where there are few variations in transistors within a pixel.

The present embodiment mode can be freely combined with the above embodiment modes.

Embodiment Mode 7

The use applications of the film-type display devices described in the above embodiment modes will be described in this embodiment mode. The film-type display devices manufacturing according to the manufacturing method or by using the manufacturing apparatus of the invention can be applied to display portions of various kinds of electronic appliances. Examples of the electronic appliances will be shown in FIGS. 20A to 20F.

Figure 20A:
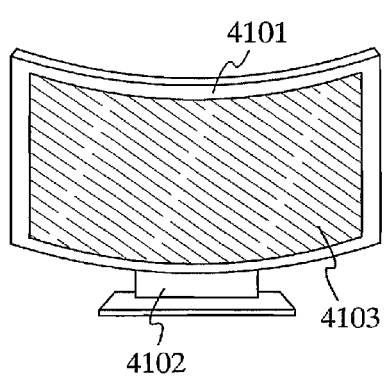
FIGS. 20A to 20F are diagrams showing electronic appliances to which display devices according to the invention are utilized.

FIG. 20A shows a display device, comprising a main body 4101, a supporting base 4102 and a display portion 4103. The display portion 4103 is formed using a flexible substrate, and therefore, a lightweight and thin display device can be realized. The display portion 4103 can be curved. Also, the display portion can be detached from the supporting base 4102 to be hanged on a wall. The display device can be manufactured by applying the manufacturing method and the manufacturing apparatus as shown in the above embodiment modes to the process of the display device 4103.

Figure 20B:
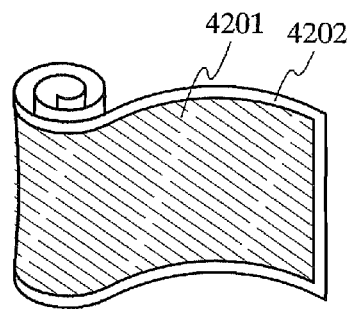

FIG. 20B shows a large size display device that can be rolled up, comprising a main body 4201 and a display portion 4202. Since the main body 4201 and the display portion 4202 are formed using flexible substrates, this display device can be carried while it is folded up or rolled up. By applying the manufacturing method and the manufacturing apparatus as shown in the above embodiment modes to the process of the display portion 4202, a lightweight and thin, large-size display device can be manufactured.

Figure 20C:
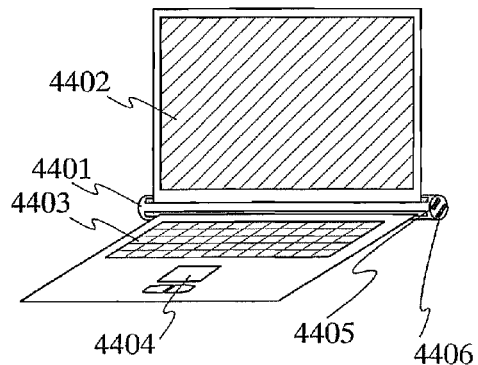

FIG. 20C shows a sheet-type computer, comprising a main body 4401, a display portion 4402, a keyboard 4403, a touch-sensitive pad 4404, an external connection port 4405, a power plug 4406 and the like. The display portion 4402 is formed using a flexible substrate, and hence, a lightweight and thin computer can be realized. Also, by providing a housing space in the power plug 4406, the display portion 2402 can be housed therein while being rolled up. By utilizing the manufacturing method and the manufacturing apparatus as shown in the above embodiment modes to form the display portion 4402, the computer can be manufactured.

Figure 20D:
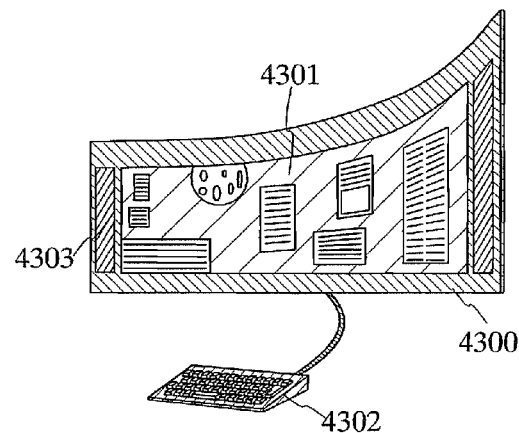

FIG. 20D shows a display device having a large area display portion with 20 to 80 inches, comprising a housing 4300, a keyboard portion 4301 that is an operation portion, a display portion 4302, speaker portions 4303 and the like. The display portion 4302 is formed using a flexible substrate. Therefore, by detaching the keyboard portion 4301 from the housing 4300, the housing 4300 can be carried while being folded up or rolled up. Bu utilizing the manufacturing method and the manufacturing apparatus as shown in the above embodiment modes to form the display portion 4302, the display device having the large area display portion can be manufactured.

Figure 20E:
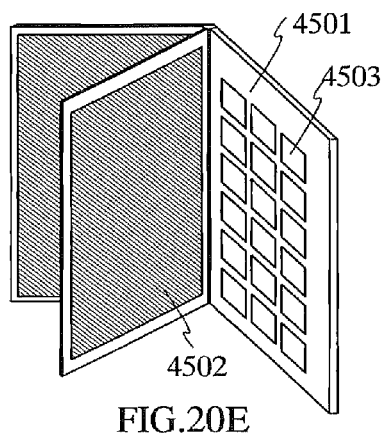

FIG. 20E shows an electronic book, comprising a main body 4501, a display portion 4502, operation keys 4503 and the like. Also, a modem may be built in the main body 4501. The display portion 4502 is formed using a flexible substrate, and hence, it can be folded up. In addition, both still images such as characters and moving images can be displayed on the display portion 4502. By utilizing the manufacturing method and the manufacturing apparatus as shown in the above embodiment modes to form the display portion 4502, the electronic book can be manufactured.

Figure 20F:
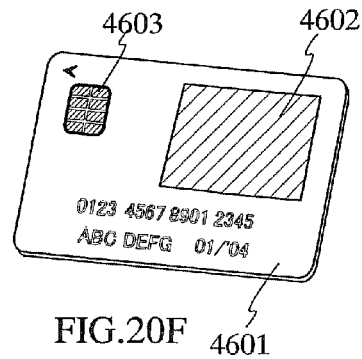

FIG. 20F shows an IC card, comprising a main body 4601, a display portion 4602, a connection terminal 4603 and the like. Since the display portion 4602 is formed using a flexible substrate, it is lightweight and thin sheet type. Therefore, the display portion can be adhered to the surface of a card. When the IC card can receive data by a non-contact method, information obtained from an external portion can be displayed on the display portion 4602. By utilizing the manufacturing method and the manufacturing apparatus as shown in the above embodiment modes to the display portion 4602, the IC card can be manufactured.

By adhering the film-type display devices of the present invention to various kinds of goods, information can be displayed on the goods. Specific examples thereof are shown in FIGS. 21A and 21B.

Figure 21A:
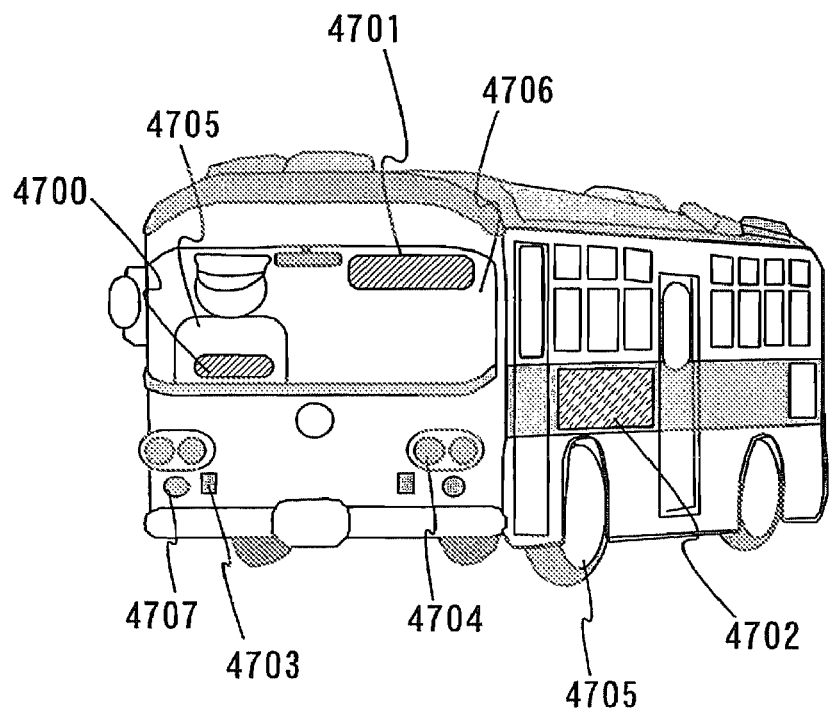
FIGS. 21A and 21B are diagrams showing electronic appliances to which display devices according to the invention are utilized.

FIG. 21A shows a bus including a camera 4707, a sensor 4703, lights 4704, wheels 4705, front glass 4706 and the like. Reference numeral 4705 represents a driver. The front glass 4706 comprises a display portion A 4700 and a display portion B 4701, on which required information is displayed. A side surface of the body comprises a display portion C 4702 on which information can be displayed as a poster and the like. Since the display portion A 4700, the display portion B 4701 and the display portion C 4702 are formed using flexible substrates, they are lightweight and thin sheet types. Therefore, these display portions can be adhered to the front glass 4706 and the side surface of the body. By utilizing the manufacturing method and the manufacturing apparatus as shown in the above embodiment modes, the display portion A 4700, the display portion B 4701 and the display portion C 4702 can be manufactured.

Figure 21B:
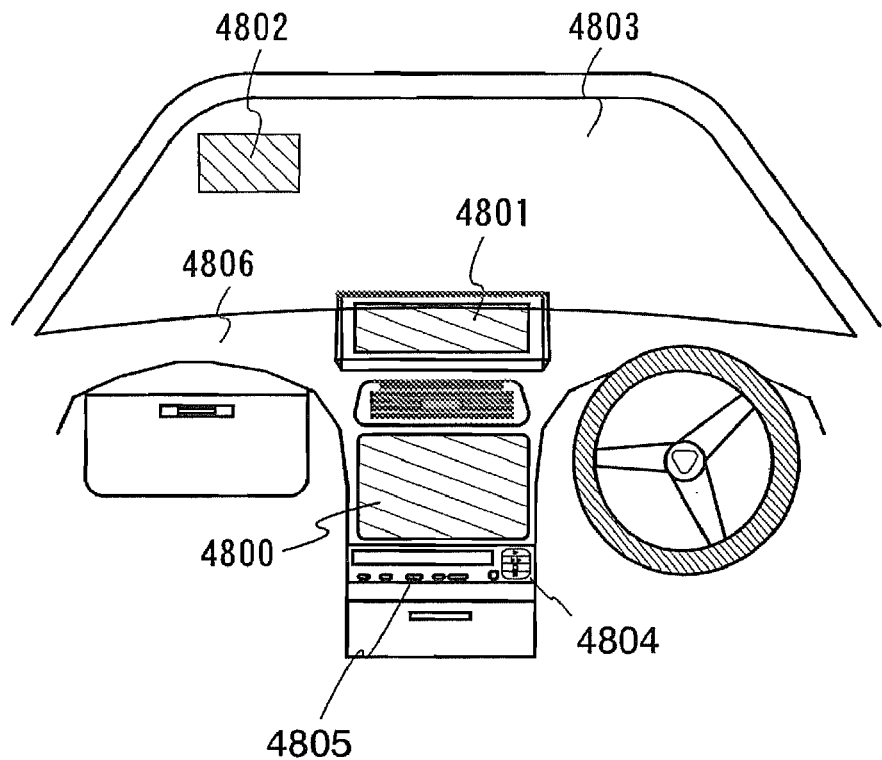

FIG. 21B shows an example where display portions are mounted on the periphery of a driver seat of a car. An audio reproducing unit, e.g., a car audio or a car navigation system is provided on a dashboard 4806. A main body 4804 of the car audio includes a display portion A 4800, a display portion B 4801 and operation buttons 4805. A display portion C 4802 is also provided on the front glass 4803. Since the respective display devices are formed using flexible substrates, they are lightweight and thin sheet types. Therefore, they can be adhered to various portions to display information thereon. By utilizing the manufacturing method and the manufacturing apparatus as shown in the above embodiment modes, the respective display devices can be manufactured.

Although the examples of vehicles are shown in this embodiment mode, the film-type display devices manufactured according to the present invention can be utilized to all over the place where is a portion for displaying information, for example, information display boards in stations of the railway and air ports and advertising billboards on the streets. As set forth above, the present invention can be widely applied to electronic appliances and information display means in various fields. Furthermore, the present invention can be implemented by being freely combined with the above embodiment modes.

What is claimed is:
1. A method for manufacturing a semiconductor device, comprising the steps of:
forming a separation layer over a substrate;
forming an element over the separation layer;

forming an opening that reaches the separation layer;

attaching a first sheet over the element while transferring the element;

separating the substrate from the element by introducing an etching agent into the opening to remove the separation layer while transferring the element;

attaching a second sheet under the element while transferring the element after separating the substrate;

separating the first sheet from the element while transferring the element after attaching the second sheet;

forming a light emitting layer over the element after separating the first sheet; and attaching a third sheet over the element while transferring the element after forming the light emitting layer.

2. A method for manufacturing a semiconductor device according to claim 1, wherein the element includes a thin film transistor.

3. A method for manufacturing a semiconductor device according to claim 1, wherein the third sheet includes a resin.

4. A method for manufacturing a semiconductor device according to claim 1, further comprising a step of retrieving the substrate into a cassette after separating the substrate from the element.

5. A method for manufacturing a semiconductor device according to claim 1, wherein the light emitting layer is formed by a droplet discharging method.

6. A method for manufacturing a semiconductor device, comprising the steps of:

forming a separation layer over a substrate;

forming an element over the separation layer;

forming an opening that reaches the separation layer;

attaching a first sheet over the element while transferring the element;

separating the substrate from the element by introducing an etching agent into the opening to remove the separation layer while transferring the element;

attaching a second sheet under the element while transferring the element after separating the substrate;

separating the first sheet from the element while transferring the element after attaching the second sheet;

forming a light emitting layer over the element after separating the first sheet;

attaching a third sheet over the element while transferring the element after forming the light emitting layer; and reeling the element and the light emitting layer onto a collection roll after attaching the third sheet.

7. A method for manufacturing a semiconductor device according to claim 6, wherein the element includes a thin film transistor.

8. A method for manufacturing a semiconductor device according to claim 6, wherein the third sheet includes a resin.

9. A method for manufacturing a semiconductor device according to claim 6, further comprising a step of retrieving the substrate into a cassette after separating the substrate from the element.

10. A method for manufacturing a semiconductor device according to claim 6, wherein the light emitting layer is formed by a droplet discharging method.

11. A method for manufacturing a semiconductor device, comprising the steps of:

forming a separation layer over a substrate;

forming an element over the separation layer;

forming an opening that reaches the separation layer;

attaching a first sheet over the element while transferring the element;

separating the substrate from the element by introducing an etching agent into the opening to remove the separation layer while transferring the element;

attaching a second sheet under the element while transferring the element after separating the substrate;

separating the first sheet from the element while transferring the element after attaching the second sheet;

forming a light emitting layer over the element after separating the first sheet;

attaching a third sheet over the element while transferring the element after forming the light emitting layer; and cutting the third sheet and the second sheet.

12. A method for manufacturing a semiconductor device according to claim 11, wherein the element includes a thin film transistor.

13. A method for manufacturing a semiconductor device according to claim 11, wherein the third sheet includes a resin.

14. A method for manufacturing a semiconductor device according to claim 11, further comprising a step of retrieving the substrate into a cassette after separating the substrate from the element.

15. A method for manufacturing a semiconductor device according to claim 11, wherein the light emitting layer is formed by a droplet discharging method.

16. A method for manufacturing a semiconductor device according to claim 1, wherein the etching agent is a gas or a liquid containing halogen fluoride.

17. A method for manufacturing a semiconductor device according to claim 6, wherein the etching agent is a gas or a liquid containing halogen fluoride.

18. A method for manufacturing a semiconductor device according to claim 11, wherein the etching agent is a gas or a liquid containing halogen fluoride.

* * * * *